United States Patent
Matsugi et al.

(10) Patent No.: US 9,656,351 B2
(45) Date of Patent: May 23, 2017

(54) SOLDER MATERIAL AND CONNECTED STRUCTURE

(71) Applicant: HIROSHIMA UNIVERSITY, Higashihiroshima-shi, Hiroshima (JP)

(72) Inventors: Kazuhiro Matsugi, Higashihiroshima (JP); Kenichiro Suetsugu, Nishinomiya (JP)

(73) Assignee: Hiroshima University, Hiroshima (JP)

( * ) Notice: Subject to any disclaimer, the term of this patent is extended or adjusted under 35 U.S.C. 154(b) by 0 days.

(21) Appl. No.: 15/101,306

(22) PCT Filed: Dec. 1, 2014

(86) PCT No.: PCT/JP2014/081726
§ 371 (c)(1),
(2) Date: Jun. 2, 2016

(87) PCT Pub. No.: WO2015/083661
PCT Pub. Date: Jun. 11, 2015

(65) Prior Publication Data
US 2016/0354868 A1    Dec. 8, 2016

(30) Foreign Application Priority Data
Dec. 3, 2013 (JP) .................... 2013-250521

(51) Int. Cl.
*B23K 35/26* (2006.01)
*H01L 23/31* (2006.01)
(Continued)

(52) U.S. Cl.
CPC ........ *B23K 35/264* (2013.01); *B23K 35/0244* (2013.01); *B23K 35/26* (2013.01);
(Continued)

(58) Field of Classification Search
CPC .. B23K 35/264; B23K 35/0244; B23K 35/26; H01L 23/3114; H01L 23/4952;
(Continued)

(56) References Cited

U.S. PATENT DOCUMENTS 6,156,132 A * 12/2000 Yamashita ........... B23K 35/264
148/400
6,361,742 B2 * 3/2002 Takeda ................... C22C 13/00
420/557
(Continued)

FOREIGN PATENT DOCUMENTS

JP    2001-353590 A    12/2001
JP    2006-167790 A    6/2006
(Continued)

OTHER PUBLICATIONS

International Search Report issued in corresponding International Patent Application No. PCT/JP2014/081726 dated Feb. 24, 2015.
(Continued)

*Primary Examiner* — Caleen Sullivan
(74) *Attorney, Agent, or Firm* — Morgan, Lewis & Bockius LLP

(57) ABSTRACT

Provided is a solder material that has a high melting point and exhibits superior mechanical characteristics, and therefore can form a connecting portion with high heat-resistant reliability.

19 Claims, 12 Drawing Sheets

(51) Int. Cl.
*H01L 23/00* (2006.01)
*H01L 23/495* (2006.01)
*B23K 35/02* (2006.01)
*C22C 12/00* (2006.01)
*H01L 21/52* (2006.01)
*H05K 3/34* (2006.01)

(52) U.S. Cl.
CPC .............. *C22C 12/00* (2013.01); *H01L 21/52* (2013.01); *H01L 23/3114* (2013.01); *H01L 23/4952* (2013.01); *H01L 23/49513* (2013.01); *H01L 23/49562* (2013.01); *H01L 23/562* (2013.01); *H01L 24/29* (2013.01); *H01L 24/32* (2013.01); *H01L 24/48* (2013.01); *H01L 24/73* (2013.01); *H05K 3/3457* (2013.01); *H01L 2224/3226* (2013.01); *H01L 2224/32245* (2013.01); *H01L 2224/48095* (2013.01); *H01L 2224/48245* (2013.01); *H01L 2224/48247* (2013.01); *H01L 2224/48472* (2013.01); *H01L 2224/73265* (2013.01); *H01L 2924/014* (2013.01); *H01L 2924/01029* (2013.01); *H01L 2924/01032* (2013.01); *H01L 2924/01047* (2013.01); *H01L 2924/01083* (2013.01); *H01L 2924/10272* (2013.01); *H01L 2924/1304* (2013.01); *H01L 2924/181* (2013.01)

(58) Field of Classification Search
CPC . H01L 23/562; H01L 24/48; H01L 23/49562; H01L 24/73; H01L 23/49513; H01L 24/29; H01L 24/32; H01L 21/52; H01L 2924/01083; H01L 2924/01029; H01L 2924/10272; H01L 2224/3226; H01L 2924/1304; H01L 2924/01032; H01L 2924/01047; H01L 2924/014; H01L 2224/48245; H01L 2224/32245; H01L 2224/48247; H01L 2924/181; H01L 2224/48095; H01L 2224/73265; H01L 2224/48472; H05K 3/3457; C22C 12/00
USPC ........................................................ 257/669
See application file for complete search history.

(56) References Cited

U.S. PATENT DOCUMENTS

| | | | |
|---|---|---|---|
| 2002/0012608 A1 | 1/2002 | Takaoka et al. | |
| 2002/0051728 A1* | 5/2002 | Sato .................... | B22F 1/0048 420/562 |
| 2004/0170524 A1* | 9/2004 | Lambracht .......... | B23K 35/264 420/577 |
| 2006/0113683 A1* | 6/2006 | Dean .................... | C22C 11/00 257/783 |
| 2008/0118761 A1 | 5/2008 | Weiser et al. | |
| 2009/0242249 A1 | 10/2009 | Furusawa et al. | |
| 2016/0155714 A1* | 6/2016 | Hilsenbeck ............ | H01L 29/43 257/762 |

FOREIGN PATENT DOCUMENTS

| | | |
|---|---|---|
| JP | 2008-161882 A | 7/2008 |
| JP | 2010-503538 A | 2/2010 |
| JP | 2013-022638 A | 2/2013 |
| WO | 2007/075763 A1 | 7/2007 |
| WO | 2008/033828 A1 | 3/2008 |

OTHER PUBLICATIONS

International Preliminary Report on Patentability issued in corresponding International Patent Application No. PCT/JP2014/081726 dated Jun. 9, 2016.

* cited by examiner (a)

(b)

《 262°C 》

(c)

《 270~271°C 》

(a)

(b)

SOLDER MATERIAL AND CONNECTED STRUCTURE

TECHNICAL FIELD

The present invention relates to a solder material, particularly, a solder material including a lead-free solder alloy based on Bi, and a connected structure obtainable by using the solder material.

BACKGROUND ART

As a solder alloy, an Sn—Pb-based alloy has been generally used. The Sn—Pb-based alloy has the eutectic point of 183° C. at a composition of Sn-37Pb (37% by weight of Pb and the balance of Sn), and the melting temperature thereof can relatively significantly be varied by adjusting the composition of Sn—Pb. The solder materials used to, for example, connect an electronic component(s) to a substrate are roughly classified based on the temperature at which the solder alloy in the solder material can be melted (the solder connecting temperature) into solder materials directed to use at a middle to low temperature (up to 250° C.) and solder materials directed to use at a high temperature (about 250 to 350° C.), and can each properly be selected according to an application of products that are finally obtained.

It is however socially required to substitute lead-containing solder alloys with lead-free solder alloys (so-called "elimination of lead") taking into consideration that lead included in Sn—Pb-based alloys may cause environmental pollution due to improper waste treatment.

As the lead-free solder alloys, Sn-based solder alloys such as, for example, an Sn—Ag-based, an Sn—Cu-based, and an Sn—Ag—Cu-based solder alloys are currently developed. These solder alloys have a relatively low melting point (up to 230° C.) and are therefore practically used in solder materials directed to use at a middle to low temperature.

As one of other lead-free solder alloys, there is known to be a Bi-based lead-free solder alloy, and this solder alloy has a relatively high melting point (see Patent Literatures 1 to 3).

CITATION LIST

Patent Literature

Patent Literature 1: JP 2001-353590 A
Patent Literature 2: JP 2010-503538 A
Patent Literature 3: JP 2013-22638 A

SUMMARY OF INVENTION

Technical Problem

The regulations for the solder alloys including lead have recently been increasingly tightened. For example, use of the solder alloys each including lead is partially permitted exceptionally under the ELV Directive and the RoHS Directive by the European Union, but the abolishment of such exceptional rules is imminent and complete "elimination of lead" from the solder materials is demanded. With the current prevalence of electric vehicles (EVs) and hybrid electric vehicles (HEVs), the engine room or the like of an automobile has many electronic components loaded thereon and a lead-free solder alloy is demanded that presents high reliability even under such an oppressive, high-temperature, and vibrational environment. In addition, in the power electronics field, use of a SiC semiconductor is currently expanded as a material for power devices instead of a Si semiconductor and a lead-free solder alloy is demanded that presents high reliability even at a high temperature to be able to withstand a higher current and/or a high voltage. It is an urgent task to realize practical use of the solder material using a solder alloy that has a high melting point and exhibits superior mechanical properties, and therefore has high heat resistance reliability.

It is however the actual state of the solder materials directed to use at a high temperature where the elimination of lead has not made any significant progress. For the traditionally known Bi-based lead-free solder alloys (see Patent Literatures 1 to 3), efforts are made by focusing on the liquidus-line temperature/solidus-line temperature thereof and these solder alloys each have a relatively high melting point while mechanical properties of the connecting portion obtained thereby is not sufficient. These solder alloys are therefore not practically used as solder materials directed to use at a high temperature.

An object of the present invention is to provide a solder material that has a high melting point and superior mechanical properties, and therefore is able to form a connecting portion having high heat resistance reliability, and to provide a connected structure obtainable by using the solder material.

Solution to Problem

Most of the state diagrams are not known for ternary and more-component solder alloys and it generally is extremely difficult to estimate the melting point of a ternary or more-component solder alloy, and in addition the relationship between its melting point or alloy composition and mechanical properties (for example, elongation) is unknown. Under such circumstances, the inventors designed a material of a solder alloy based on a binary eutectic melting model and executed further active studies and verifications. As a result, the inventors completed the present invention.

According to one gist of the present invention, there is provided a solder material comprising, as a solder alloy, a second alloy obtainable by using a first alloy and a Bi—Ag alloy at a ratio of 5 to 80% by weight for the Bi—Ag alloy relative to a total amount of the first alloy and the Bi—Ag alloy, the first alloy being obtainable by using a Bi—Cu alloy and a Bi—Ge alloy at a ratio of 30 to 70% by weight for the Bi—Cu alloy relative to a total amount of the Bi—Cu alloy and the Bi—Ge alloy, wherein the Bi—Cu alloy consists of 0.2 to 0.8% by weight of Cu and a balance of Bi (hereinafter also described as Bi-(0.2-0.8)Cu), the Bi—Ge alloy consists of 0.7 to 1.3% by weight of Ge and a balance of Bi (hereinafter also described as Bi-(0.7-1.3)Ge), and the Bi—Ag alloy consists of 2.2 to 20.3% by weight of Ag and a balance of Bi (hereinafter also described as Bi-(2.2-20.3)Ag).

In a preferred aspect of the solder material of the present invention, the Bi—Cu alloy is a Bi—Cu eutectic alloy, and the Bi—Ge alloy is a Bi—Ge eutectic alloy, and the Bi—Ag alloy consists of 2.5 to 20% by weight of Ag and a balance of Bi (hereinafter also described as Bi-(2.5-20)Ag).

More specifically, the Bi—Cu alloy may consist of 0.5% by weight of Cu and a balance of Bi (hereinafter also described as Bi-0.5Cu), the Bi—Ge alloy may consist of 1.0% by weight of Ge and a balance of Bi (hereinafter also described as Bi-1.0Ge).

As is clear to those skilled in the art, when an alloy composition is described as, for example, "Bi-0.5Cu", this refers to a composition that consists of 0.5% by weight (or "% by mass", and the same is hereinafter applied) of Cu and a balance (in this case, 99.5% by weight) of Bi relative to the overall amount of the described metal elements and, when an alloy composition is described as, for example, "Bi-(0.2-0.8)Cu", this refers to a composition that consists of 0.2 to 0.8% by weight of Cu and a balance (in this case, 99.8 to 99.2% by weight, providing that the total amount is 100% by weight) of Bi relative to the overall amount of the described metal elements. Not especially described otherwise herein, the compositions will be described using the similar expressions. A solder alloy having its composition described in this manner does not necessarily need to consist of the listed metal elements only, and an element(s) of a trace amount may be present therein that are inevitably mixed thereinto instead of a portion of the metal element constituting the balance (Bi).

In another aspect of the present invention, there is provided a solder material comprising, as the solder alloy, instead of the second alloy, a third alloy obtainable by using the second alloy and at least one of Ni and P at a ratio of 0.05 to 2.0% by weight for the at least one of Ni and P relative to a total amount of the second alloy and the at least one of Ni and P.

The solder material of the present invention may, in one aspect thereof, further comprise, in the solder alloy, at least one of Cu particles and Ni particles having an average particle diameter of 1 to 40 μm at about 1 to 20% by weight relative to a total amount of the solder alloy and the at least one of the Cu particles and the Ni particles.

In any one of the aspects of the present invention, the solder alloy included in the solder material may have a solidus-line temperature of 250 to 350° C.

In one aspect of the present invention, the solder alloy may be in a form of particles and a surface of the particles may be coated with a material that has a melting point higher than the solidus-line temperature of the solder alloy.

According to another gist of the present invention, there is provided a connected structure formed by connecting two members with each other between parts for connection of the respective two members by any one of the solder material in said one gist of the present invention.

In a preferred aspect of the connected structure of the present invention, the parts for connection of the respective two members have an Sn content of less than 0.5% by weight in a material constituting at least a surface part of the parts for connection.

The part for connection of at least one of the two members may be plated with any one selected from a group consisting of Bi plating, Ni plating, Au plating, and Ni-based and Au-flash plating.

Advantageous Effects of Invention

According to the present invention, the first alloy is prepared by using the Bi-(0.2-0.8)Cu alloy and the Bi-(0.7-1.3)Ge alloy at the ratio of 30 to 70% by weight for the former relative to the total amount of these alloys, the second alloy is prepared by using the first alloy and the Bi-(2.2-20.3)Ag alloy at the ratio of 5 to 80% by weight for the latter relative to the total amount of these alloys, and the second alloy (or the third alloy derived from the second alloy) is used as the solder alloy included in the solder material. The solder material is thereby provided that has a high melting point and exhibits superior mechanical properties, and therefore can form a connecting portion presenting high heat resistance reliability. In addition, according to the one aspect of the present invention, the Cu particles and/or the Ni particles present in the solder alloy, and the solder material can thereby be realized that has a higher melting point (typically, a solidus-line temperature) of the solder alloy (that becomes a particle dispersed solder alloy). According to the other aspect of the present invention, the surface of the particles of the solder alloy is coated with a material having a higher melting point than the solidus-line temperature of the solder alloy, and the solder material can thereby be realized that has a higher temperature at which the solder material decomposes/melts.

Figure 11:
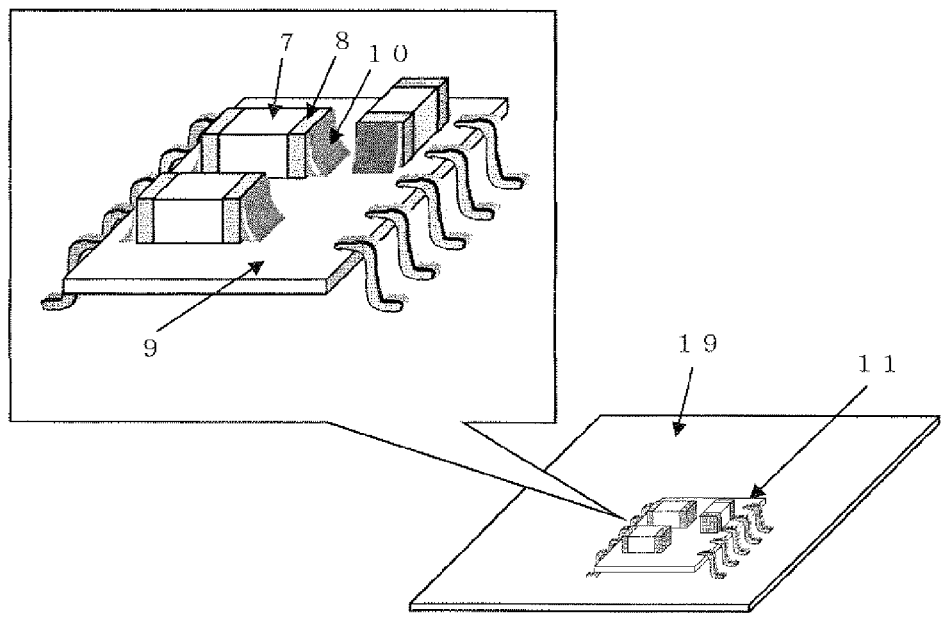
Figure 11:
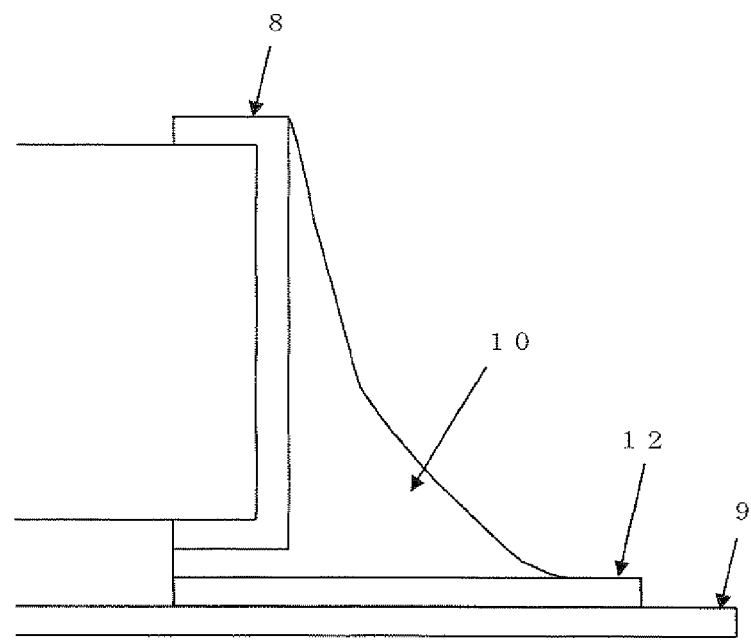

Item (a) of FIG. 11 shows a schematic perspective view of an application example of a connected structure in an embodiment of the present invention, and item (b) of FIG. 11 shows a partial enlarged schematic cross-sectional view of (a).

Figure 12:
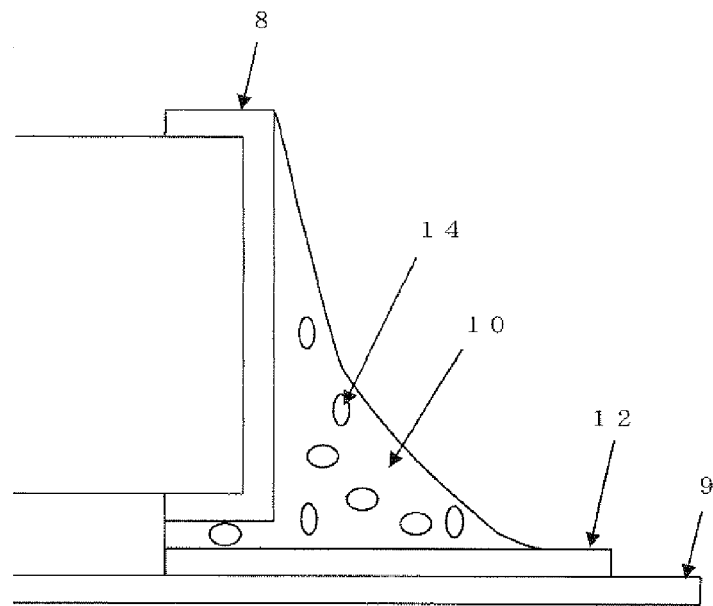

FIG. 12 shows a view of further application example of the connected structure in an embodiment of the present invention, which corresponds to item (b) of FIG. 11.

Figure 13:
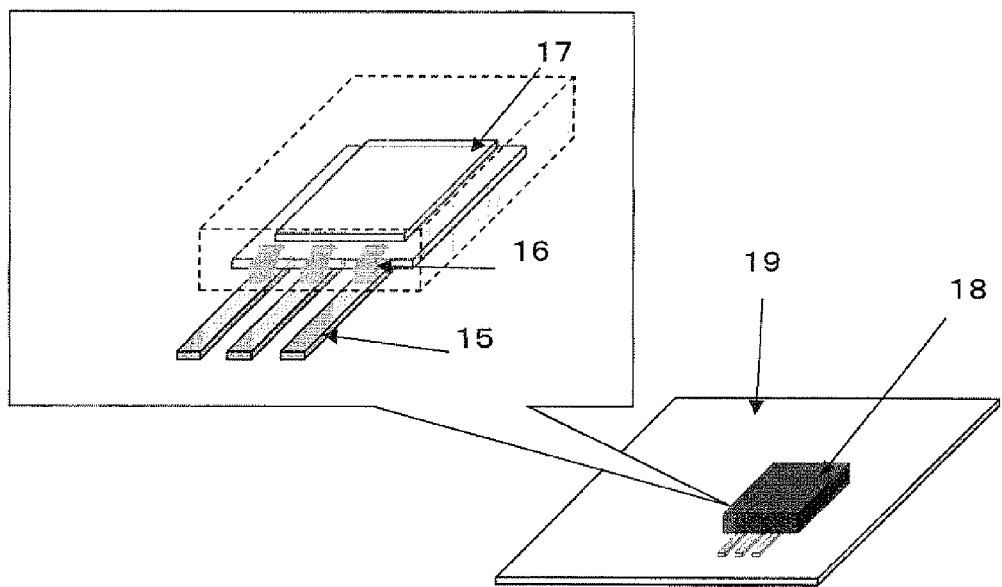

FIG. 13 shows a schematic perspective view of a yet further application example of the connected structure in an embodiment of the present invention.

Figure 14:
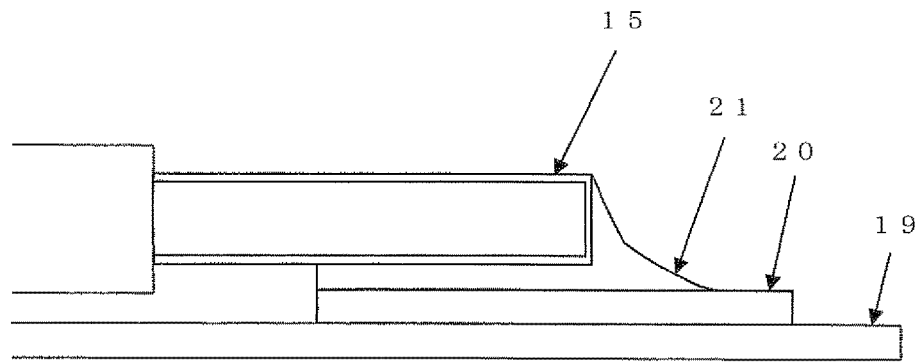

FIG. 14 shows a schematic cross-sectional view of a yet further application example of the connected structure in an embodiment of the present invention.

Figure 15:
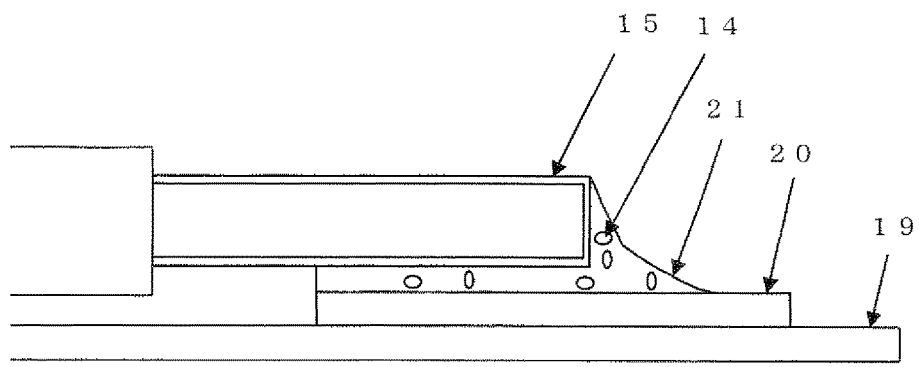

FIG. 15 shows a schematic cross-sectional view of a yet further application example of the connected structure in an embodiment of the present invention, which corresponds to FIG. 14.

DESCRIPTION OF EMBODIMENTS

Embodiments of the present invention will be described in detail below with reference to the drawings.

First Embodiment

This embodiment relates to an aspect where a second alloy (see FIG. 1) is used as a solder alloy included in the solder material.

Figure 1:
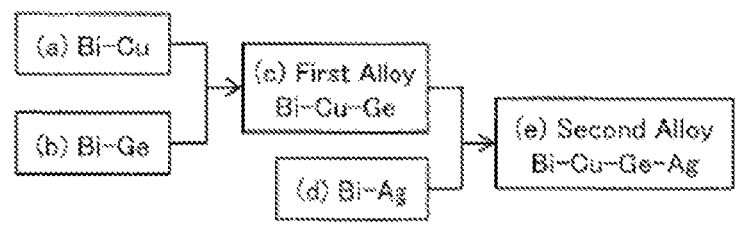
FIG. 1 shows a flowchart of a preparation method of a solder alloy in one embodiment of the present invention.

With reference to FIG. 1, (a) a Bi—Cu alloy and (b) a Bi—Ge alloy are first prepared, and (c) a first alloy is prepared by using these alloys.

For (a) the Bi—Cu alloy, it is most advantageous to use Bi-0.5Cu that is an eutectic composition thereof, while Bi-(0.2-0.8)Cu may practically be used, and preferably Bi-(0.3-0.7)Cu and more preferably Bi-(0.4-0.6)Cu may be used therefor.

On the other hand, for (b) the Bi—Ge alloy, it is most advantageous to use Bi-1.0Ge that is a eutectic composition of (b) the Bi—Ge alloy while Bi-(0.7 to 1.3)Ge may practically be used therefor. Preferably, Bi-(0.8 to 1.2)Ge and, more preferably, Bi-(0.9 to 1.1)Ge may be used therefor.

(c) A first alloy is prepared by using (a) the Bi—Cu alloy and (b) the Bi—Ge alloy at a ratio of 30 to 70% by weight, e.g. 40 to 60% by weight, for the Bi—Ge alloy relative to the total amount of these alloys (in other words, using these alloys at a weight ratio of 70:30 to 30:70, e.g. 60:40 to 40:60). A general alloy preparation method may be used as the preparation method of the first alloy and melt mixing may typically be applied.

The eutectic composition of the Bi—Cu alloy is Bi-0.5Cu which has the eutectic point of 270° C. The eutectic composition of the Bi—Ge alloy is Bi-1.0Ge which has the eutectic point of 271° C. When an alloy is prepared by using these two types of binary alloy both with the eutectic composition or a composition close to the eutectic composition, the first alloy obtainable from the binary alloys can prevent an extreme drop of the melting point from occurring. Though the present invention is not bound by any theory, it can considered as to this effect that Bi—Cu and Bi—Ge are each present in a stable state in the ternary Bi—Cu—Ge alloy obtained from the binary Bi—Cu eutectic (or quasi-eutectic) alloy and the binary Bi—Ge eutectic (or quasi-eutectic) alloy (a binary eutectic melting model), and thereby occurrence of extreme drop of the melting point can be prevented. Because the eutectic points of the two alloys are extremely close to each other, the first alloy obtainable from these alloys (that is, the Bi—Cu—Ge alloy) may have a melting point (typically, the solidus-line temperature) of about 270° C.

With reference again to FIG. 1, (e) a second alloy is prepared by using (c) the first alloy prepared as above and (d) a Bi—Ag alloy separately prepared.

For (d) the Bi—Ag alloy, it is desirable to use Bi-2.5Ag that is the eutectic composition thereof, or an alloy including Ag at a larger content than that of Bi-2.5Ag and equal to or lower than about 20% by weight (i.e. Bi-(2.5-20)Ag). However, Bi-(2.2-20.3)Ag may practically be used, and preferably Bi-(2.3-20.2)Ag, more preferably Bi-(2.4-20.1)Ag may be used.

(e) A second alloy is prepared by using (c) the first alloy and (d) the Bi—Ag alloy at a ratio of 5 to 80% by weight, e.g. 5 to 40% by weight, for the Bi—Ag alloy relative to the total amount of these alloys (in other words, using these alloys at a weight ratio of 95:5 to 20:80, e.g. 95:5 to 60:40). A general alloy preparation method may also be used as the preparation method of the second alloy and melt mixing may typically be applied.

The eutectic composition of the Bi—Ag alloy is Bi-2.5Ag which has the eutectic point of 262° C. that is lower than the eutectic points of the Bi—Cu alloy and the Bi—Ge alloy. It can be considered that, when the second alloy is prepared from the first alloy together with the Bi—Ag alloy at the eutectic composition thereof or a composition close thereto, for example, Bi-(2.2-2.8)Ag, preferably Bi-(2.3-2.7)Ag, more preferably Bi-(2.4-2.6)Ag, and most preferably Bi-2.5Ag, the second alloy can have a stable metal composition and can be provided with an excellent mechanical nature. As the Ag content of the Bi—Ag alloy is increased exceeding that of the eutectic composition or the composition close thereto, the liquidus-line temperature is increased. In the case of Bi-11Ag, for example, the solidus-line temperature is 262° C. and the liquidus-line temperature is about 360° C. The second alloy obtained by using the first alloy prepared as above and Bi-(2.2-20.3)Ag has the solidus-line temperature of, for example, 250 to 350° C., and typically 260 to 320° C., and no extreme drop of the melting point is observed.

In this embodiment, the second alloy prepared as above is used as a solder alloy to obtain a solder material including at least this solder alloy.

In the present invention, the solder material only has to include at least the solder alloy. For example, the solder alloy may be used as it is as the solder material, is usable for, for example, flow soldering in a molten state, and otherwise may be shaped into the form of a wire solder. Alternatively, a solder material may be obtained by combining the second alloy with other materials. For example, a so-called solder paste may be obtained by shaping the second alloy into particles and mixing the particles with any suitable flux, and this solder paste is usable for reflow soldering and the like. Further, the second alloy may be shaped into a flux-cored wire solder by shaping the second alloy together with the flux. The flux-cored wire solder may be obtained by any suitable method and can be obtained by, for example, using the flux in a liquid form or a paste form as a core material and using the second alloy in the form of particles around one or two or more of the core material to shape them into a wire as a whole by extending the core material inside the wire.

The solder material of the present invention may be used to obtain a connected structure by connecting (soldering) any suitable two members to each other between parts for connection of the respective two members, and the two members can thereby be electrically and physically connected therebetween. For example, the solder material is usable for obtaining a desired electronic apparatus by connecting (or soldering, that is same as each other in the present invention) an electronic component and a substrate between an electrode of the electronic component and a land of the substrate, connecting a semiconductor element (or a semiconductor chip) and a lead frame between a lower face electrode of the semiconductor element and a die pad of the lead frame, or executing the like.

As to the parts for connection of the two members, the material constituting at least a surface part thereof has an Sn content of, preferably less than 0.5% by weight, more preferably not more than 0.4% by weight, and yet more preferably not more than 0.3% by weight, and most preferably has substantially no Sn content. For example, one or both of the parts for connection may be plated and the plating may be any one selected from a group consisting of Bi plating, Ni plating, Au plating, and Ni-based and Au flash plating. With the material of the parts for connection, Sn is not mixed into the solder connecting portion at a significant amount and therefore Sn-58% Bi eutectic alloy as a low melting point alloy (whose eutectic point is 138° C.) is not generated or can be sufficiently suppressed, and the heat resistance reliability can therefore be maintained.

Especially, when the part for connection of the member which is to be connected includes Cu (for example, the part is a Cu electrode), the part for connection tends to be affinitive to Cu present in the solder alloy of the solder material of the present invention and excellent connecting strength can be acquired.

Figure 2:
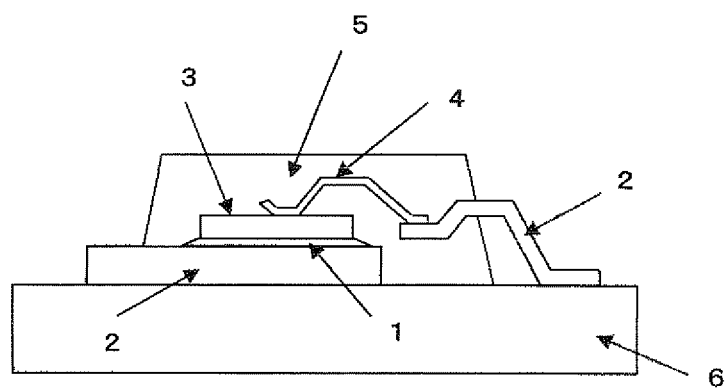
FIG. 2 shows a schematic cross-sectional view of an example of a connected structure in one embodiment of the present invention.

As a more specific example, a large capacity power electronic apparatus will be described with reference to FIG. 2. The power electronic apparatus includes a lead frame 2, a semiconductor element (a power device) 3, a bonding wire 4 that electrically connects an upper face electrode (an electrode pad) of the semiconductor element 3 and a lead of the lead frame 2 with each other, a solder connecting portion 1 that electrically connects a die pad of the lead frame 2 and a lower face electrode of the semiconductor element 3 with each other, a sealing resin 5 that seals therein the semiconductor element 3, and a mother substrate 6 for loading these components thereon (the mother substrate 6 is not essential). The power electronic apparatus is fabricated, for example, as follows. The lead frame 2 is first prepared. The lead frame 2 may be, for example, a lead frame formed by providing a Fe core material with Ni-plating, although the lead frame 2 is not limited to this. The die pad (the part for connection) of the lead frame 2 is applied with the solder material described in this embodiment generally in the form of a solder paste. The semiconductor element 3 that may be made of SiC or Si is loaded such that an electrode (the part for connection) formed on the lower face thereof is in contact with the solder paste, to be soldered by being heated (see FIG. 3). The solder connecting portion 1 including the solder material in the form of substantially only the solder alloy is thereby formed and the semiconductor element 3 and the lead frame 2 are electrically and mechanically connected with each other. An electrode (an electrode pad) formed on the upper face of the semiconductor element and a lead (an external terminal) of the lead frame 2 are thereafter connected with each other by forming the bonding wire 4 by, for example, wire bonding using an Au wire. As depicted, the sealing resin 5 thereafter seals therein the whole of the semiconductor element 3 and the connecting portion thereof. For example, an epoxy resin, a silicone resin or the like that is reinforced by glass fibers may be used as the sealing resin 5.

It is required to the solder alloy of the solder material to give no damage to the member to be connected during the soldering. It is also required especially to the power electronic apparatus that the solder material (more specifically, the solder alloy) of the solder connecting portion 1 is not melted and deformed to secure high connecting strength between the semiconductor element and the die pad even when the temperature of the semiconductor element is increased by flowing therethrough of a large current or application thereto of a high voltage.

The solder alloy based on Bi is used for the solder material of the present invention. To prevent or suppress any damage to the member to be connected during the soldering, it is effective to mitigate the stress generated when the solder alloy solidifies. In the present invention, Bi, that is a metal whose volume expands during solidification, is selected as the main component of the solder alloy and it can be considered that the stress during the solidification of the solder alloy is thereby mitigated. Though Ge is also a metal whose volume expands during solidification, Bi is more inexpensive than Ge and is therefore advantageous in respect of the cost.

Since Bi has, however, a mechanical nature of brittle, in order to improve this point the inventors have studied addition of Cu and Ge. In addition, an effect can be achieved by adding Ge that oxidation of the solder alloy can be suppressed. The inventors have conceived that two types of structurally stable eutectic alloy are used as the raw materials based on the binary eutectic melting model. In the present invention, the Bi—Cu alloy and the Bi—Ge alloy are used with the eutectic compositions thereof or the compositions close to the eutectic compositions (Bi-(0.2-0.8)Cu and Bi-(0.7-1.3)Ge) and occurrence of extreme drop of the melting point can thereby be prevented. Because the eutectic points of the Bi—Cu alloy and the Bi—Ge alloy are extremely close to each other (that are respectively 270° C. and 271° C.), it can be considered that these components melt at the same temperature of about 270° C.

The inventors further have studied addition of Ag taking into consideration the melting point, the workability, and the like. In the present invention, the Bi—Ag alloy is used with the Ag content from that of its eutectic composition or the composition close to the eutectic composition to a predetermined amount (Bi-(2.2-20.3)Ag) as above and, thereby, both of the melting temperature and the mechanical properties (for example, elongation) can be improved while preventing occurrence of extreme drop of the melting point.

Figure 3:
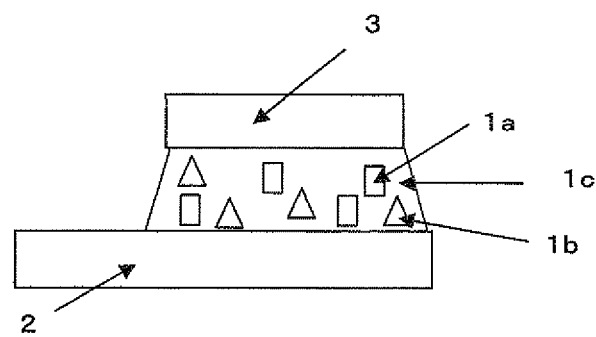
FIG. 3 shows schematic views expressing a melting process for the case of subjecting a solder material to temperature rise wherein the solder material includes as a solder alloy a second alloy obtained by preparing a first alloy from Bi-0.5Cu and Bi-1.0Ge and mixing the first alloy with Bi-2.5Ag.
Figure 3:
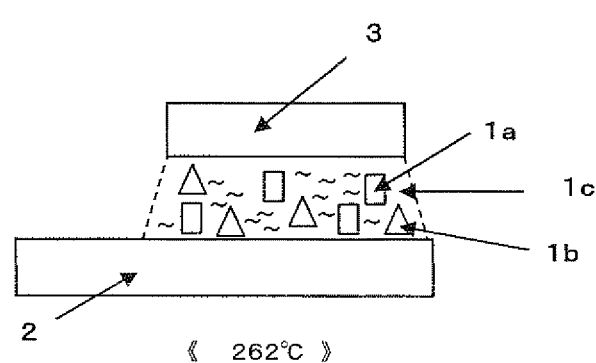
Figure 3:
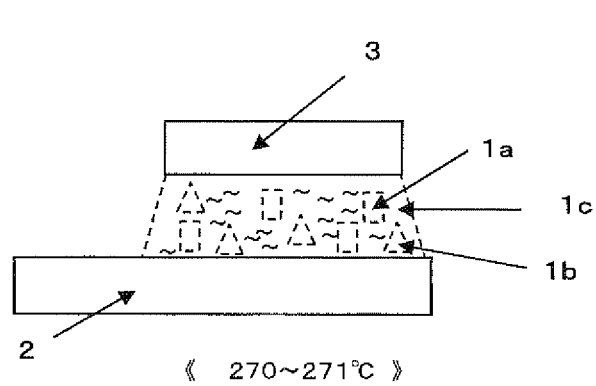

The melting process will be discussed with reference to FIG. 3 for the case of subjecting a solder material to temperature rise wherein the solder material includes as the solder alloy the second alloy obtained by mixing Bi-2.5Ag with the first alloy which is obtained from Bi-0.5Cu and Bi-1.0Ge. The temperature is raised from the normal temperature state depicted in item (a) of FIG. 3, and reaches 262° C. at which as depicted in item (b) of FIG. 3 Bi-2.5Ag (schematically depicted by "1c" in item (b) of FIG. 3) first starts to melt. At this time, Bi-0.5Cu (eutectic point of 270° C.) and Bi-1.0Ge (eutectic point of 271° C.) present in the solder alloy (respectively depicted schematically by "1a" and "1b" in item (b) of FIG. 3) do not melt at 262° C. and are each in the solid state, but thereafter, as depicted in item (c) of FIG. 3, each independently start to melt when the temperature is raised to 270 to 271° C. A solid-liquid coexistence region is therefore present between 262° C. and 270 to 271° C., and application of the stress (for example, expansive stress) at one time during solidification of the solder alloy can be mitigated.

Figure 4:
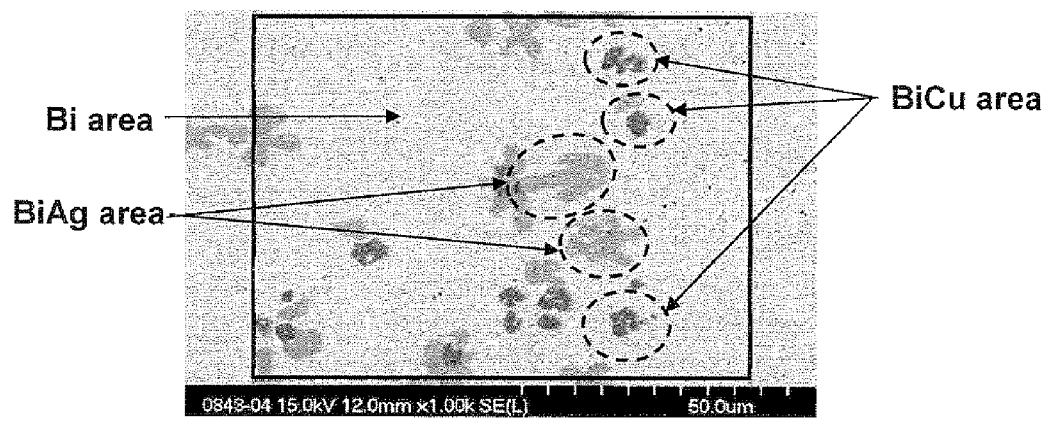
FIG. 4 shows an SEM photograph of a solder alloy obtained by melt mixing with each other two types of eutectic alloy that are Bi-0.5Cu and Bi-2.5Ag.
Figure 5:
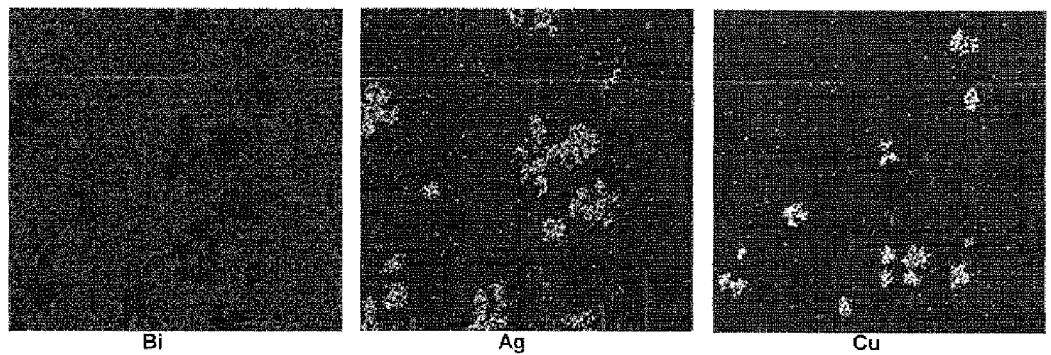
FIG. 5 shows distribution maps of respective metal elements (Bi, Ag, and Cu) by EDX (Energy Dispersive X-ray analyzer) mapping of the solder alloy obtained by melt mixing with each other two types of eutectic alloy that are Bi-0.5Cu and Bi-2.5Ag.

For reference, FIG. 4 and FIG. 5 respectively depict an SEM (Scanning Electron Microscope) photograph of the solder alloy obtained by melt mixing with each other the two types of eutectic alloy that are Bi-0.5Cu and Bi-2.5Ag, and distribution maps of respective metal elements (Bi, Ag, and Cu) by EDX (Energy Dispersive X-ray analyzer) mapping. It is understood from these drawings that BiCu and BiAg each distribute in a coagulated state.

Furthermore, in the present invention, occurrence of extreme drop of the melting point can be prevented for the second alloy obtained as above. On the other hand, for the traditional Bi-based lead-free solder alloys described in Patent Literatures 1 to 3, when another metal element is unthoughtfully added thereto for the purpose of improving the brittleness of Bi, an eutectic alloy having an extremely low eutectic point is generated due to the type of the added metal element, the dispersion of the addition ratio, and the like. The melting point (typically, the solidus-line temperature) of the Bi-based alloy is therefore lowered and, as a result, it is concerned that the heat resistance reliability of the solder connecting portion is degraded to cause problems such as poor solder flowing, voids, and occurrence of chipping/cracking of the semiconductor element due to degradation of the connecting. According to the present invention, such a concern can be swept away.

As understood from the above, the solder material of the present invention has the solidus-line temperature in a high temperature region of 250 to 350° C. and exhibits superior mechanical properties, that is, for example, the solder material has stable mechanical properties even when the solder material is exposed to an atmosphere at a temperature of about 300° C., and as a result, a connecting portion having high heat resistance reliability can be formed. In addition, the solder material of the present invention can effectively prevent oxidation of the solder alloy, that would cause troubles especially in a high temperature state. A lead-free solder material directed to use at a high temperature can therefore be realized that is excellent in the connecting adhesiveness or the connecting stability with a part for connection of a member to be connected. A connected structure obtained by using the solder material has an improved elongation of the connecting portion and excellent connecting strength. The connected structure can therefore maintain the high connecting strength even when the connected structure is repeatedly exposed to a large temperature difference (for example, a temperature difference caused by turning on or off of an electronic component or a semiconductor element, or a temperature difference in an engine room of an automobile) or even when a stress is applied to the connecting interface (a stress generated during the solidification of the solder alloy or a stress generated by external vibrations generated in an on-vehicle or a portable electronic apparatus), and the connected structure is therefore excellent in the heat resistance reliability and the impact resistance.

Second Embodiment

This embodiment relates to an aspect where a third alloy (see FIG. 6) is used as the solder alloy included in the solder material.

Figure 6:
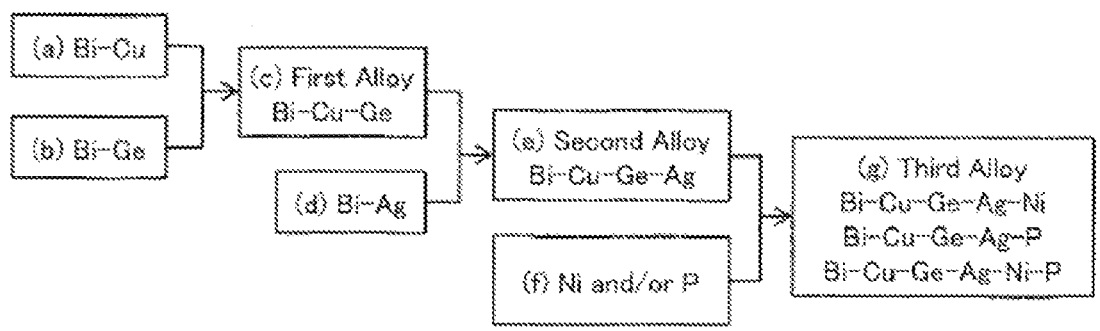
FIG. 6 shows a flowchart of a preparation method of a solder alloy in another embodiment of the present invention.

With reference to FIG. 6, (e) a second alloy is prepared similarly to the second alloy in the first embodiment, and (g) a third alloy is prepared by using (e) the second alloy and separately prepared (f) Ni and/or P.

Ni and/or P are/is a additive metal element(s) to the solder alloy, and any one of Ni and P may be used or both thereof may be used. (g) The third alloy is prepared by using Ni and/or P at a ratio of 0.05 to 2.0% by weight, e.g. 0.1 to 1.5% by weight, relative to the total amount of the second alloy and Ni and/or P. A general alloy preparation method may be used as the preparation method of the third alloy and melt mixing may typically be applied.

The third alloy obtained from the above constitutes a Bi—Cu—Ge—Ag—Ni alloy when only Ni is used as the metal element to be added, constitutes a Bi—Cu—Ge—Ag—P alloy when only P is used as the metal element to be added, and constitutes a Bi—Cu—Ge—Ag—Ni—P alloy when Ni and P are used as the metal elements to be added.

The third alloy obtained in this manner has the solidus-line temperature of, for example, 250 to 350° C. and typically 270 to 320° C.

In this embodiment, the third alloy prepared as above is used as the solder alloy to obtain a solder material including at least this solder alloy.

In addition, the similar explanations to those of the first embodiment are also applicable to this embodiment and the similar effects to those of the first embodiment can be achieved. Furthermore, in this embodiment, the third alloy having the predetermined amount of Ni and/or P added thereto is used as the solder alloy, and the mechanical properties, especially elongation, of the solder connecting portion can thereby be improved. For example, it is possible to obtain elongation of 1% or higher, specifically 1 to 15%, and typically 1 to 10%.

Third Embodiment

This embodiment relates to an aspect where a particle dispersed second alloy (see FIG. 7) is used as the solder alloy included in the solder material.

Figure 7:
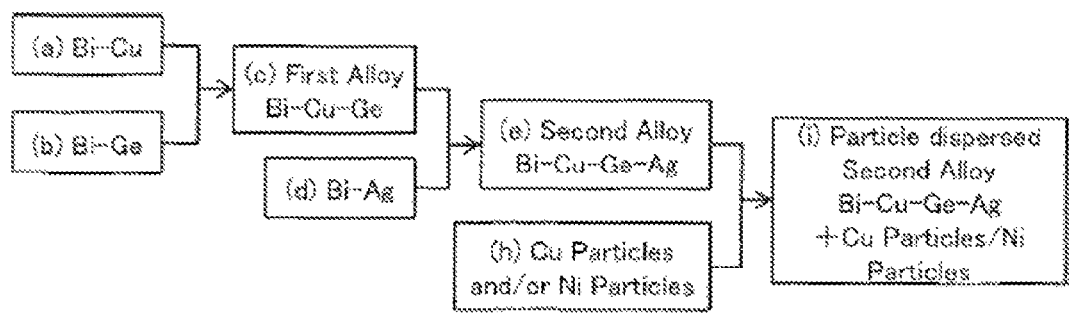
FIG. 7 shows a flowchart of a preparation method of a solder alloy in yet another embodiment of the present invention.

With reference to FIG. 7, (e) a second alloy is prepared similarly to the second alloy in the first embodiment, and (i) a particle dispersed second alloy is prepared by using (e) the second alloy and separately prepared (h)Cu particles and/or Ni particles.

The Cu particles and/or the Ni particles are additive metal particles to be included in the solder alloy, and any one of the Cu particles and/or the Ni particles may be used or both thereof may be used. The Cu particles and/or the Ni particles each have the average particle diameter (the number average particle diameter) of about 1 to 40 μm, for example, about 10 to 40 μm, and typically about 20 to 30 μm, and are used at a ratio of about 1 to 20% by weight and, for example, about 1 to 17% by weight relative to the total amount of the solder alloy and the used Cu particles and/or the Ni particles.

The solder alloy obtained as above is generally described as a solder alloy that has the second alloy (a Bi—Cu—Ge—Ag alloy) as its matrix and the Cu particles and/or the Ni particles present being dispersed in the matrix. The particle dispersed second alloy obtained in this manner has the solidus-line temperature of, for example, 250 to 350° C. and typically 270 to 320° C.

In this embodiment, the particle dispersed second alloy prepared as above is used as the solder alloy to obtain the solder material including at least this solder alloy.

In addition, the similar explanations to those of the first embodiment are also applicable to this embodiment and the similar effects to those of the first embodiment can be achieved. Furthermore, in this embodiment, the second alloy added with the predetermined amount of the Cu particles and/or the Ni particles is used as the solder alloy, and the melting point (typically, the solidus-line temperature) of the solder alloy can further be increased because these particles do not melt at 250° C. to 350° C.

Fourth Embodiment

This embodiment relates to an aspect where a particle dispersed third alloy (see FIG. 8) is used as the solder alloy included in the solder material.

Figure 8:
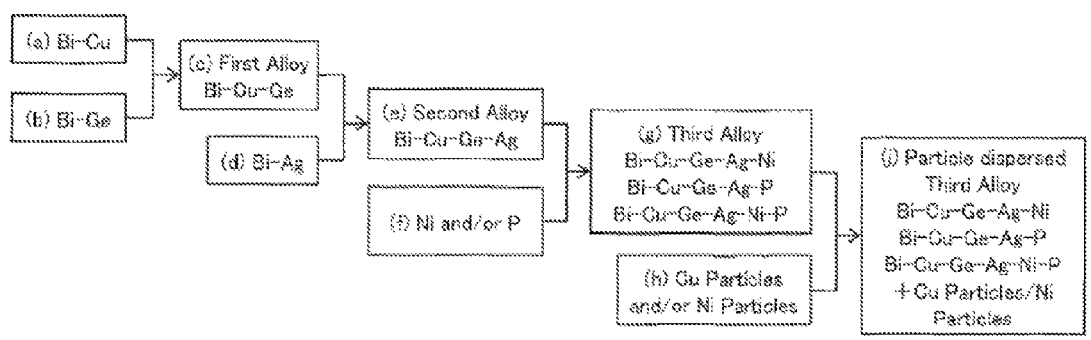
FIG. 8 shows a flowchart of a preparation method of a solder alloy in yet another embodiment of the present invention.

With reference to FIG. 8, (g) a third alloy is prepared similarly to the third alloy in the second embodiment, and (j) a particle dispersed third alloy is prepared by using (g) the third alloy and the separately prepared (h)Cu particles and/or Ni particles.

The Cu particles and/or the Ni particles are additive metal particles to be included in the solder alloy, and any one of the Cu particles and/or the Ni particles may be used or both thereof may be used. The Cu particles and/or the Ni particles each have the average particle diameter (the number average particle diameter) of about 1 to 40 μm, for example, about 10 to 40 μm, and typically about 20 to 30 μm, and are used at a ratio of about 1 to 20% by weight and, for example, about 1 to 17% by weight relative to the total amount of the solder alloy and the used Cu particles and/or the Ni particles.

The solder alloy acquired as above is generally described as a solder alloy that has the third alloy (a Bi—Cu—Ge—Ag—Ni alloy when only Ni is used as the additive metal element, a Bi—Cu—Ge—Ag—P alloy when only P is used as the additive metal element, and a Bi—Cu—Ge—Ag—Ni—P alloy when Ni and P are used as the additive metal elements) as its matrix and the Cu particles and/or the Ni particles present being dispersed in the matrix. The particle dispersed third alloy obtained in this manner has the solidus-line temperature of, for example, 250 to 350° C. and typically, 270 to 320° C.

In this embodiment, the particle dispersed third alloy prepared as above is used as the solder alloy to obtain a solder material including at least this solder alloy.

In addition, the similar explanations to those of the first embodiment are also applicable to this embodiment and the similar effects to those of the first embodiment can be achieved. Furthermore, in this embodiment, the third alloy added with the predetermined amount of the Cu particles and/or the Ni particles is used as the solder alloy, and the mechanical properties, especially elongation, of the solder connecting portion can thereby be improved similarly to the second embodiment, and the melting point (typically, the solidus-line temperature) of the solder alloy can further be increased similarly to the third embodiment.

Fifth Embodiment

This embodiment relates to an aspect where the solder alloy included in the solder material is in the form of particles and the surface of the particles is coated with a material having the melting point higher than the solidus-line temperature of the solder alloy.

Solder particles 31 (see FIG. 9) are first prepared. The solder particles only have to be solder particles including the solder alloy and having a particle shape. The average particle diameter (the number average particle diameter) of the solder particles may properly be selected according to the application and the like of the solder material, while the average particle diameter may be within a range of, for example, about 10 to 100 μm, and especially 20 to 75 μm.

The solder particles can be obtained by shaping the solder alloy into particles using any suitable method. For example, the solder particles can be prepared by shaping the second alloy described in the first embodiment and/or the third alloy described in the second embodiment into particles. For example, the solder particles may be prepared by shaping the particle dispersed second alloy described in the third embodiment and/or the particle dispersed third alloy described in the fourth embodiment into particles. When the particle dispersed second alloy and/or the particle dispersed third alloy are/is used, the Cu particles and/or the Ni particles (not shown) may have the average particle diameter smaller than the desired average particle diameter of the solder particles to be able to be dispersed among the solder particles 31, and may preferably have the average particle diameter of not more than ¾, more preferably not more than ½, and yet more preferably not more than ¼ of the average particle diameter of the solder particles.

Figure 9:
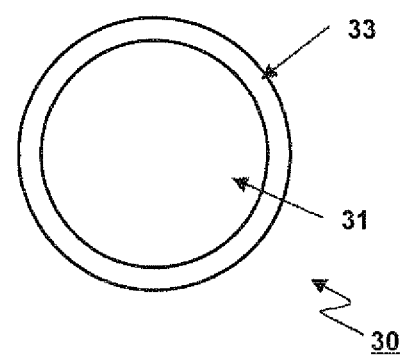
FIG. 9 shows a schematic cross-sectional view of a particle included in a solder material in yet another embodiment of the present invention.

As schematically shown in FIG. 9, the surface of each of the solder particles 31 is coated with the material having the melting point higher than the solidus-line temperature of the solder alloy to form a coating film 33. Hereinafter, this material will also be referred to simply as "high melting point material" and the coating film formed by the high melting point material will also be referred to simply as "high melting point film".

The high melting point material only has to be a material whose melting point is higher than the solidus-line temperature of the solder alloy used for the solder particles. Depending also on the used solder alloy, the high melting point material may have the melting point that is, for example, not more than 280° C. The high melting point material may form an intermetallic compound(s) or a solid solution(s) with the solder alloy, and at least one of the intermetallic compound(s) or solid solution(s) may melt at a temperature higher than the solidus-line temperature of the solder alloy, that is, for example, at 280 to 350° C. and preferably 300 to 350° C., or the high melting point material itself may melt at a temperature higher than the solidus-line temperature of the solder alloy that is, for example, at 280 to 350° C. and preferably 300 to 350° C. As the high melting point material, Ni, Ag, a ceramic (for example, titania ($TiO_2$), alumina/titania ($Al_2O_3/TiO_2$), zinc sulfide, and silica), and the like are each usable. Note that the high melting point materials do not include Sn.

The coating method is not especially limited. The solder particles can be coated with the high melting point material using, for example, an electroless plating process, a vapor deposition method, a sputtering method, a template method (a molecular mold method), a coating method, or the like. Although the electroless plating is amorphous as the plating is formed by precipitation, this plating can be crystalized by applying thermal treatment thereto. Thus, whether the high melting point film is set to be amorphous or crystalline can be arbitrarily selected according to the application and the like of the solder material.

The thickness of the high melting point film 33 may properly be selected according to the used high melting point material, the material and the dimensions of the solder alloy, the soldering conditions, and the like, and the high melting point film 33 only has to at least partially decompose and/or melt at a temperature higher than the solidus-line temperature of the solder alloy. The thickness of the high melting point film can be adjusted by varying the coating conditions, can properly be selected in a range of about 1 nm to 1,000 μm, and may be in a range of, for example, about 1 to 30 μm. Each of the solder particles is ideally coated on the overall surface thereof with the high melting point material while this is not essential and a portion of the surface of the solder particle(s) may be exposed.

As described in the above, the particles 30 wherein the surfaces of the solder particles 31 is coated with the high melting point films 33 (hereinafter, referred also to as "coated particles") are obtained. The coated particles 30 form a particulate material (a lump of particles) and a so-called solder paste can typically be obtained by mixing the particulate material with any suitable flux or the like.

The solder material of this embodiment includes the coated particles 30 and, in addition to this, may include any other suitable materials such as, for example, flux and the like. In the case where soldering (for example, reflow soldering) is conducted by using the solder material, when the temperature is increased by heating, because the coated particles 30 are coated by the high melting point film 33, the coated particles 30 are substantially not decomposed/melted at the solidus-line temperature of the solder alloy. At a higher temperature of, for example, 280° C. or more, especially 300° C. or more, and preferably 350° C. or lower, the coated particles 30 are decomposed/melted, so that the solder alloy constituting the solder particles 31 inside the coated particles 30 elutes. The soldering is thereafter conducted by the molten solder alloy and the heating comes to an end.

Figure 10:
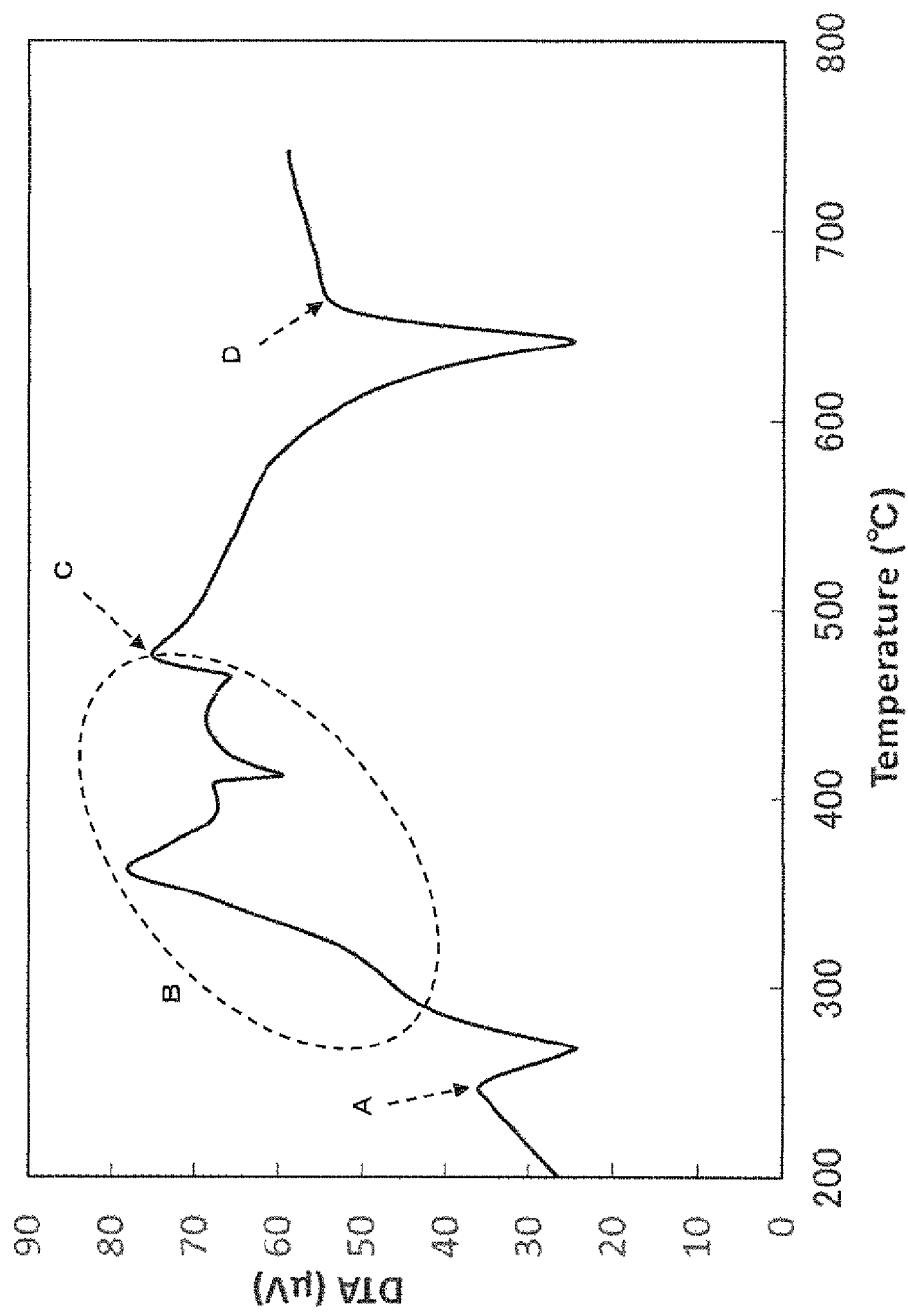
FIG. 10 shows a graph as the result of a differential thermal analysis (DTA) of Bi-2.5Ag particulate material coated with Ni.

For reference, a graph is shown in FIG. 10 which is obtained by subjecting a particulate material to a differential thermal analysis (DTA), wherein the particulate material is formed by coating the particles of Bi-2.5Ag alloy with Ni. The axis of abscissa thereof represents a temperature (° C.) during the heating, and the axis of ordinate "DTA" thereof represents a thermocouple electromotive force difference ($\mu$V) and this corresponds to the temperature difference and further to the reaction heat amount.

The Ni-coated Bi-2.5Ag particles were prepared as follows. Solder particles (having the average particle diameter of about 30 $\mu$m) of Bi-2.5Ag were first prepared and were applied with ultrasonic cleaning in acetone to remove fat on the surface of the solder particles. Thus obtained solder particles were immersed in an electroless plating bath to form the high melting point film by applying Ni plating to the surface of the solder particles. The composition of the electroless plating bath was $NiSO_4.6H_2O$-30 g/l; $NaH_2PO_2.H_2O$-20 g/l; $CH_3COONa.3H_2O$-20 g/l. The thickness of the high melting point film (the Ni plating) was about 5 to 10 $\mu$m. Any thermal treatment was thereafter not executed to leave the high melting point film (the Ni plating) to be amorphous as it was. Though the present invention is not bound by any theory, it can considered that Ni forming the high melting point films and Bi to be the main component of the solder particles are mutually diffused into each other at the interface between the high melting point film (the Ni plating) and the surface of the solder particle to generate a gradient in Ni concentration.

With reference again to FIG. 10, when the Ni-coated Bi-2.5Ag particles were heated during the DTA analysis, the first peak appears at a point A (248.6° C.) and it can be considered that this peak is generated due to appearance of a liquid phase caused by the primary crystal melting. Then, in the portion of the curve surrounded by a dotted line B, it can be considered that various intermetallic compounds or solid solutions gradually melt and are liquefied along the liquidus line of each of the components, where the liquefaction may be considered as including liquefaction of $NiBi_3$. It can also be considered that the liquefaction of $NiBi_3$ comes to an end at the peak of a point C (470° C.) and among the intermetallic compound between Ni and Bi, only NiBi remains in solid phase. It can be considered that the liquefaction of NiBi comes to an end thereafter at a point D (655° C.)

From the above result, it can be considered that the Ni-coated Bi-2.5Ag particles do not melt at the melting point of the Bi-2.5Ag solder alloy (the eutectic point 262° C.) and, at a temperature higher than this, the high melting point film (especially, $NiBi_3$ that has a melting point higher than the melting point of the solder alloy while that has a low melting point among the intermetallic compounds formed between Ni and Bi) is decomposed/melted and the solder alloy inside the high melting point film melts for the first time to be able to form the solder connecting. It is understood that this is not limited to that of the Ni-coated Bi-2.5Ag particles as the reference example on which the DTA analysis was conducted and is also applicable to the solder material of this embodiment. When a ceramic (such as titania, alumina/titania, or silica) is used as the high melting point material, the high melting point film of the ceramic (the ceramic shell) decomposes/melts due to deformation/damage of the shell (the high melting point film) by the thermal expansion, and the solder alloy inside the shell thereby elutes for the first time to be able to form the solder connecting.

The solder material of this embodiment includes the coated particles 30 and can realize a solder material that decomposes/melts at a higher temperature compared to that of the solder material including the solder particles not coated with the high melting point films. In the solder connecting portion formed using this solder material, there may be present a material originated from the high melting point film that decomposes/melts at a temperature higher than the melting point of the solder alloy, more specifically, an intermetallic compound(s) or a solid solution(s) having a melting point higher than that of the solder alloy, or a shell material that is deformed/damaged at a temperature higher than the melting point of the solder alloy. The solder connecting portion made of the composite material of these has the average melting point that is higher than that made of the solder alloy only, and thus the solder connecting portion can be formed having higher heat resistance reliability. In addition, the similar explanations to those of the first to the fourth embodiments are also applicable to this embodiment according to the used solder alloy.

Various connected structures can be obtained by using the solder materials of the first to the fifth embodiments. The power electronic apparatus can be obtained as exemplified with reference to FIG. 2 in the first embodiment and, in addition, the present invention is usable for obtaining various connected structures as described in the following application examples.

Application Example 1 of Connected Structure

As shown in item (a) and (b) of FIG. 11, a module component 11 may be obtained by connecting an electronic component 7 and a module substrate 9 by forming a solder connecting portion 10 between an electrode 8 of the electronic component 7 and an electrode land 12 (see item (b) of FIG. 11) of the module substrate 9 by using the solder material of the present invention as described in detail in the first to the fifth embodiments. In other words, the solder connecting portion 10 of the module component substantially consists of the solder material of the present invention such as, for example, the solder alloy of the solder material described in detail in the first to the fifth embodiments. When the solder alloy includes the Cu particles and/or the Ni particles, see FIG. 12. The module component 11 configured in this manner may be loaded on a mother substrate 19 for fabrication to constitute an electric or an electronic apparatus. Especially, it is required to the module component that the solder material (more specifically, the solder alloy) of the solder connecting portion 10 does not melt to maintain the high frequency property. The similar explanations to those of the first to the fifth embodiments are also applicable to this application example and the similar effects to those of the first to the fifth embodiments can be achieved.

In this application example, the electrode 8 of the electronic component 7 and/or the electrode land 12 of the module substrate 9 may have plating (not shown) thereon.

More specifically, the electrode 8 of the electronic component 7 and/or the electrode land 12 of the module substrate 9 may be applied with plating thereto whose Sn content is less than 0.5% by weight. For example, the module component 11 may be fabricated by using the electronic component 7 of which electrode 8 is plated by Ni-based and Au-flash plating (whose Sn content ratio is less than 0.5% by weight except inevitable impurities) and by using the module substrate 9 of which electrode land 12 is a Cu electrode land (whose Sn content ratio is less than 0.5% by weight except inevitable impurities). In this case, the metal elements that may be present in the solder alloy in the solder connecting portion 10 are, taking into consideration the metal elements that may be mixed thereinto from the parts for connection, Bi, Cu, Ge, Ag, and Ni (and P when P is added to the solder alloy, and/or the high melting point material depending on the case), and Sn is not mixed thereinto at a significant amount.

For example, in the case where Bi plating is applied to the electrode 8 of the electronic component 7, as to the constituent elements of the high temperature solder material after the connecting, the metal elements that may be present in the solder alloy in the solder connecting portion are, taking into consideration the metal elements that may be mixed thereinto from the parts for connection, Bi, Cu, Ge, and Ag (and P when P is added to the solder alloy, Ni when Ni is added to the solder alloy and/or when Ni particles are included in the solder alloy as shown in FIG. 12, and/or the high melting point material depending on the case), and Sn is not mixed therein at a significant amount. Excellent heat resistance reliability can be maintained similarly to the case where the Ni-based and Au-flash plating is applied.

Application Example 2 of Connected Structure

As shown in FIG. 13, a power transistor (a semiconductor mounting component) 18 may be obtained by connecting a flat lead 15 and a metal foil 17 using therebetween a solder material 16 of the present invention as described in detail in the first to the fifth embodiments in the inside of a semiconductor mounting component associated with generation of a large amount of heat due to flowing therethrough of a large current or application thereto of a high voltage, such as a power transistor. The power transistor 18 constituted in this manner is mounted on the mother substrate 19 to be fabricated to be able to form an electric/electronic apparatus. Especially, for a power transistor, it is required that the solder material (more specifically, the solder alloy) of the solder connecting portion 16 does not melt not to break the electric connection. The similar explanations to those of the first to the fifth embodiments are also applicable to this application example and the similar effects to those of the first to the fifth embodiments can be achieved.

In this application example, the flat lead 15 may be plated (not shown).

Application Example 3 of Connected Structure

As shown in FIG. 14, an electronic component or a semiconductor mounting component such as a power transistor and the mother substrate 19 may be connected with each other by using the solder material 21 of the present invention described in detail in the first to the fifth embodiments between the flat lead 15 of the semiconductor mounting component or the electronic component and an electrode land 20 of the mother substrate 19. See FIG. 15 for the case where the solder alloy includes Cu particles and/or Ni particles. The similar explanations to those of the first to the fifth embodiments are also applicable to this application example and the similar effects to those of the first to the fifth embodiments can be achieved.

In this application example, the flat lead 15 of the semiconductor mounting component or the electronic component, and/or the electrode land 20 of the mother substrate 19 may each be plated (not shown).

More specifically, the flat lead 15 and/or the electrode land 12 of the module substrate 9 may be applied with plating whose Sn content is less than 0.5% by weight. For example, an electronic component mounting substrate may be fabricated by using the flat lead 15 that is applied with Ni-based and Au-flash plating (whose Sn content ratio is less than 0.5% by weight except inevitable impurities) and by using the mother substrate 19 of which electrode land 20 is a Cu electrode land (whose Sn content ratio is less than 0.5% by weight except inevitable impurities). In this case, the metal elements that may be present in the solder alloy in the solder connecting portion 21 are, taking into consideration the metal elements that may be mixed thereinto from the parts for connection, Bi, Cu, Ge, Ag, and Ni (and P when P is added to the solder alloy, and/or the high melting point material depending on the case), and Sn is not mixed thereinto at a significant amount.

For example, in the case where Bi plating is applied to the electrode 8 of the electronic component 7, as to the constituent elements of the high temperature solder material after the connecting, the metal elements that may be present in the solder alloy in the solder connecting portion are, taking into consideration the metal elements that may be mixed thereinto from the parts for connection, Bi, Cu, Ge, and Ag (and P when P is added to the solder alloy, Ni when Ni is added to the solder alloy and/or when the Ni particles are included in the solder alloy as shown in FIG. 15, and/or the high melting point material depending on the case), and Sn is not mixed thereinto at a significant amount. Excellent heat resistance reliability can be maintained similarly to the case where the Ni-based and Au-flash plating is applied.

The embodiments of the present invention and the application examples thereof have been described in detail. However, the solder material of the present invention and the connected structure using the solder material are directed to a solder material including at least the solder alloy described above and a connected structure wherein any two members are connected by using the solder material, and therefore they are not limited to the embodiments and the application examples thereof. For example, the shapes and the materials of the substrate, elements, or devices those having the part for connection (a conductor) on their surface, the number of conductors, and the like are not limited to those of the embodiments and may be widely changed, replaced, extended, and the like in various ways.

EXAMPLES

Examples of the present invention and Comparative Examples will be described below in detail.

Experimental Example 1

This experimental example relates to the first embodiment described with reference to FIG. 1.

As shown in Tables 1 to 3 below, in Examples 1 to 30 and Comparative Examples 1 to 10, (c) the first alloy was prepared by using (a) the Bi-0.5Cu eutectic alloy and (b) the Bi-1.0Ge eutectic alloy at the mixing ratio shown in the tables, and then (e) the second alloy was prepared by using (c) this first alloy and (d) the Bi-2.5Ag eutectic alloy at the mixing ratio shown in the tables. The respective alloy compositions of the first and the second alloy (solder alloy) thus prepared are also shown in the tables.

In the preparation of the solder alloy, the Bi—Ag alloy, which improves the mechanical nature, most significantly influences the mounting quality such as elongation, bridging, cracks, and the like. In Comparative Examples, therefore, the mixing ratio of the Bi—Ag alloy was set to be 4.9% by weight and 80.1% by weight that were very slightly shifted from the range specified in the present invention.

For the solder material including the solder alloy of Examples and Comparative Examples, evaluation was conducted according to the test methods below for the solidus-line temperature and the liquidus-line temperature (also respectively simply referred to as "solidus temperature" and "liquidus temperature") as the melting point, and, as mechanical properties, elongation, bridging occurrence rate of a module component fabricated similarly to that of Application Example 1 (the electrode 8 of the electronic component 7 was applied with the Ni-based and Au-flash plating, and a Cu electrode land was used as the electrode land 12 of the module substrate 9), and defective mounting rate in a heat cycle test. The results are also shown in Tables 1 to 3.

Melting Point

The solder alloy was dripped into glycerin to rapidly be cooled and solidified, and was thereafter stored in a cylindrical tube as samples each cut to have a weight of about 30 mg, and subjected to measurement according to thermal flow rate DSC (Differential Scanning calorimetry) method. For the DSC evaluation conditions, the measurement temperature range was set to be from the normal temperature to 500° C., the atmosphere was nitrogen, $Al_2O_3$ was used as a reference, and the sampling interval was set to be 1 sec. The temperature increase rate was set to be 5° C./min. From the heat analysis temperature profile obtained thereby, the starting point of endothermic reaction was determined to be the solidus (solidus-line) temperature (° C.) and the ending point of endothermic reaction was determined to be the liquidus (liquidus-line) temperature (° C.).

Elongation (%)

Three ingots were casted with the melting temperature of 350° C. and the mold temperature of 50° C. using 1.5 kg of the solder alloy. Three No. 4-test pieces each according to JIS Z2201:2011 were produced from each of the ingots. The test pieces were subjected to tensile testing at the room temperature under the condition of a straining rate of 30%/min to measure yield elongation (%).

Bridging and Heat Cycle

A solder paste was obtained from particles of the solder alloy and flux. The solder paste was applied to the electrode land of the test substrate. A chip resistor component (2012) was mounted thereon and subjected to reflow soldering. The reflow peak temperature was set to be a temperature higher than the melting point (the liquidus temperature) of the solder alloy by 20° C. For the obtained substrate whereon the chip resistor component was mounted, the occurrence rate was determined for the bridging formed by the solder alloy extending on the electrodes therebetween. The obtained substrate whereon the chip resistor component was mounted was subjected to a heat cycle test at temperatures of −40° C. to +125° C. to determine the heat resistance fatigue strength of the substrate. The substrate was held for 30 minutes at the temperatures of −40° C. and +125° C. to conduct the test for up to 1,500 cycles. The chip resistor component was buried in a resin together with the electrode, was ground to observe the solder connecting portion in the cross-sectional surface, and presence or absence of any cracking (cracks) in the solder to calculate the defective mounting rate.

TABLE 1

| | First Alloy | | | | | Second Alloy | |
|---|---|---|---|---|---|---|---|
| | Preparation | | Alloy Composition (wt %) | | | Preparation | |
| | Material | Mixing Ratio (wt %) | Bi | Cu | Ge | Material | Mixing Ratio (wt %) |
| Example 1 | (a) 99.5Bi—0.5Cu | 30 | 99.2 | 0.15 | 0.7 | (c) First Alloy 99.15Bi—0.15Cu—0.7Ge | 95 |
| | (b) 99.0Bi—1.0Ge | 70 | | | | (d) 97.5Bi—2.5Ag | 5 |
| Example 2 | (a) 99.5Bi—0.5Cu | 30 | 99.2 | 0.15 | 0.7 | (c) First Alloy 99.15Bi—0.15Cu—0.7Ge | 60 |
| | (b) 99.0Bi—1.0Ge | 70 | | | | (d) 97.5Bi—2.5Ag | 40 |
| Example 3 | (a) 99.5Bi—0.5Cu | 30 | 99.2 | 0.15 | 0.7 | (c) First Alloy 99.15Bi—0.15Cu—0.7Ge | 20 |
| | (b) 99.0Bi—1.0Ge | 70 | | | | (d) 97.5Bi—2.5Ag | 80 |
| Example 4 | (a) 99.5Bi—0.5Cu | 70 | 99.4 | 0.35 | 0.3 | (c) First Alloy 99.35Bi—0.35Cu—0.3Ge | 95 |
| | (b) 99.0Bi—1.0Ge | 30 | | | | (d) 97.5Bi—2.5Ag | 5 |
| Example 5 | (a) 99.5Bi—0.5Cu | 70 | 99.4 | 0.35 | 0.3 | (c) First Alloy 99.35Bi—0.35Cu—0.3Ge | 60 |
| | (b) 99.0Bi—1.0Ge | 30 | | | | (d) 97.5Bi—2.5Ag | 40 |
| Example 6 | (a) 99.5Bi—0.5Cu | 70 | 99.4 | 0.35 | 0.3 | (c) First Alloy 99.35Bi—0.35Cu—0.3Ge | 20 |
| | (b) 99.0Bi—1.0Ge | 30 | | | | (d) 97.5Bi—2.5Ag | 80 |
| Example 7 | (a) 99.5Bi—0.5Cu | 30 | 99.2 | 0.15 | 0.7 | (c) First Alloy 99.15Bi—0.15Cu—0.7Ge | 95 |
| | (b) 99.0Bi—1.0Ge | 70 | | | | (d) 95.0Bi—5.0Ag | 5 |
| Example 8 | (a) 99.5Bi—0.5Cu | 30 | 99.2 | 0.15 | 0.7 | (c) First Alloy 99.15Bi—0.15Cu—0.7Ge | 60 |
| | (b) 99.0Bi—1.0Ge | 70 | | | | (d) 95.0Bi—5.0Ag | 40 |
| Example 9 | (a) 99.5Bi—0.5Cu | 30 | 99.2 | 0.15 | 0.7 | (c) First Alloy 99.15Bi—0.15Cu—0.7Ge | 20 |
| | (b) 99.0Bi—1.0Ge | 70 | | | | (d) 95.0Bi—5.0Ag | 80 |
| Example 10 | (a) 99.5Bi—0.5Cu | 70 | 99.4 | 0.35 | 0.3 | (c) First Alloy 99.35Bi—0.35Cu—0.3Ge | 95 |
| | (b) 99.0Bi—1.0Ge | 30 | | | | (d) 95.0Bi—5.0Ag | 5 |
| Example 11 | (a) 99.5Bi—0.5Cu | 70 | 99.4 | 0.35 | 0.3 | (c) First Alloy 99.35Bi—0.35Cu—0.3Ge | 60 |
| | (b) 99.0Bi—1.0Ge | 30 | | | | (d) 95.0Bi—5.0Ag | 40 |
| Example 12 | (a) 99.5Bi—0.5Cu | 70 | 99.4 | 0.35 | 0.3 | (c) First Alloy 99.35Bi—0.35Cu—0.3Ge | 20 |
| | (b) 99.0Bi—1.0Ge | 30 | | | | (d) 95.0Bi—5.0Ag | 80 |

TABLE 1-continued

|  | Second Alloy Alloy Composition (wt %) | | | | Evaluation | | | | |
|---|---|---|---|---|---|---|---|---|---|
|  | | | | | Melting Point | | | | |
|  | | | | | Solidus Temp. | Liquidus Temp. | Elongation | Bridging | Heat Cycle |
|  | Bi | Cu | Ge | Ag | (° C.) | (° C.) | (%) | (%) | (%) |
| Example 1 | 99.07 | 0.14 | 0.67 | 0.13 | 285 | 281 | 0.5 | 0 | 0 |
| Example 2 | 98.49 | 0.09 | 0.42 | 1.00 | 281 | 283 | 0.6 | 0 | 0 |
| Example 3 | 97.83 | 0.03 | 0.14 | 2.00 | 283 | 285 | 0.7 | 0 | 0 |
| Example 4 | 99.26 | 0.33 | 0.29 | 0.13 | 285 | 281 | 0.5 | 0 | 0 |
| Example 5 | 98.61 | 0.21 | 0.18 | 1.00 | 271 | 273 | 1.2 | 0 | 0 |
| Example 6 | 97.87 | 0.07 | 0.06 | 2.00 | 272 | 290 | 2.2 | 0 | 0 |
| Example 7 | 98.94 | 0.14 | 0.67 | 0.25 | 270 | 272 | 0.7 | 0 | 0 |
| Example 8 | 97.49 | 0.09 | 0.42 | 2.00 | 271 | 277 | 0.6 | 0 | 0 |
| Example 9 | 95.83 | 0.03 | 0.14 | 4.00 | 271 | 295 | 3.8 | 0 | 0 |
| Example 10 | 99.13 | 0.33 | 0.29 | 0.25 | 272 | 291 | 0.7 | 0 | 0 |
| Example 11 | 97.61 | 0.21 | 0.18 | 2.00 | 280 | 289 | 2.3 | 0 | 0 |
| Example 12 | 95.87 | 0.07 | 0.06 | 4.00 | 281 | 288 | 3.0 | 0 | 0 |

TABLE 2

| | First Alloy | | | | | Second Alloy | |
|---|---|---|---|---|---|---|---|
| | Preparation | | | | | Preparation | |
| | Material | Mixing Ratio (wt %) | Alloy Composition (wt %) | | | Material | Mixing Ratio (wt %) |
| | | | Bi | Cu | Ge | | |
| Example 13 | (a) 99.5Bi—0.5Cu | 30 | 99.2 | 0.15 | 0.7 | (c) First Alloy 99.15Bi—0.15Cu—0.7Ge | 95 |
| | (b) 99.0Bi—1.0Ge | 70 | | | | (d) 89.0Bi—11.0Ag | 5 |
| Example 14 | (a) 99.5Bi—0.5Cu | 30 | 99.2 | 0.15 | 0.7 | (c) First Alloy 99.15Bi—0.15Cu—0.7Ge | 60 |
| | (b) 99.0Bi—1.0Ge | 70 | | | | (d) 89.0Bi—11.0Ag | 40 |
| Example 15 | (a) 99.5Bi—0.5Cu | 30 | 99.2 | 0.15 | 0.7 | (c) First Alloy 99.15Bi—0.15Cu—0.7Ge | 20 |
| | (b) 99.0Bi—1.0Ge | 70 | | | | (d) 89.0Bi—11.0Ag | 80 |
| Example 16 | (a) 99.5Bi—0.5Cu | 70 | 99.4 | 0.35 | 0.3 | (c) First Alloy 99.35Bi—0.35Cu—0.3Ge | 95 |
| | (b) 99.0Bi—1.0Ge | 30 | | | | (d) 89.0Bi—11.0Ag | 5 |
| Example 17 | (a) 99.5Bi—0.5Cu | 70 | 99.4 | 0.35 | 0.3 | (c) First Alloy 99.35Bi—0.35Cu—0.3Ge | 60 |
| | (b) 99.0Bi—1.0Ge | 30 | | | | (d) 89.0Bi—11.0Ag | 40 |
| Example 18 | (a) 99.5Bi—0.5Cu | 70 | 99.4 | 0.35 | 0.3 | (c) First Alloy 99.35Bi—0.35Cu—0.3Ge | 20 |
| | (b) 99.0Bi—1.0Ge | 30 | | | | (d) 89.0Bi—11.0Ag | 80 |
| Example 19 | (a) 99.5Bi—0.5Cu | 30 | 99.2 | 0.15 | 0.7 | (c) First Alloy 99.15Bi—0.15Cu—0.7Ge | 95 |
| | (b) 99.0Bi—1.0Ge | 70 | | | | (d) 85.0Bi—15.0Ag | 5 |
| Example 20 | (a) 99.5Bi—0.5Cu | 30 | 99.2 | 0.15 | 0.7 | (c) First Alloy 99.15Bi—0.15Cu—0.7Ge | 60 |
| | (b) 99.0Bi—1.0Ge | 70 | | | | (d) 85.0Bi—15.0Ag | 40 |
| Example 21 | (a) 99.5Bi—0.5Cu | 30 | 99.2 | 0.15 | 0.7 | (c) First Alloy 99.15Bi—0.15Cu—0.7Ge | 20 |
| | (b) 99.0Bi—1.0Ge | 70 | | | | (d) 85.0Bi—15.0Ag | 80 |
| Example 22 | (a) 99.5Bi—0.5Cu | 70 | 99.4 | 0.35 | 0.3 | (c) First Alloy 99.35Bi—0.35Cu—0.3Ge | 95 |
| | (b) 99.0Bi—1.0Ge | 30 | | | | (d) 85.0Bi—15.0Ag | 5 |
| Example 23 | (a) 99.5Bi—0.5Cu | 70 | 99.4 | 0.35 | 0.3 | (c) First Alloy 99.35Bi—0.35Cu—0.3Ge | 60 |
| | (b) 99.0Bi—1.0Ge | 30 | | | | (d) 85.0Bi—15.0Ag | 40 |
| Example 24 | (a) 99.5Bi—0.5Cu | 70 | 99.4 | 0.35 | 0.3 | (c) First Alloy 99.35Bi—0.35Cu—0.3Ge | 20 |
| | (b) 99.0Bi—1.0Ge | 30 | | | | (d) 85.0Bi—15.0Ag | 80 |

|  | Second Alloy Alloy Composition (wt %) | | | | Evaluation | | | | |
|---|---|---|---|---|---|---|---|---|---|
|  | | | | | Melting Point | | | | |
|  | | | | | Solidus Temp. | Liquidus Temp. | Elongation | Bridging | Heat Cycle |
|  | Bi | Cu | Ge | Ag | (° C.) | (° C.) | (%) | (%) | (%) |
| Example 13 | 98.64 | 0.14 | 0.67 | 0.55 | 270 | 275 | 0.8 | 0 | 0 |
| Example 14 | 95.09 | 0.09 | 0.42 | 4.40 | 271 | 280 | 6.2 | 0 | 0 |
| Example 15 | 91.03 | 0.03 | 0.14 | 8.80 | 273 | 282 | 9.1 | 0 | 0 |
| Example 16 | 98.83 | 0.33 | 0.29 | 0.55 | 275 | 287 | 5.3 | 0 | 0 |
| Example 17 | 95.21 | 0.21 | 0.18 | 4.40 | 276 | 291 | 4.2 | 0 | 0 |
| Example 18 | 91.07 | 0.07 | 0.06 | 8.80 | 273 | 297 | 7.8 | 0 | 0 |
| Example 19 | 98.44 | 0.14 | 0.67 | 0.75 | 271 | 275 | 1.0 | 0 | 0 |
| Example 20 | 93.49 | 0.09 | 0.42 | 6.00 | 271 | 280 | 6.2 | 0 | 0 |
| Example 21 | 87.83 | 0.03 | 0.14 | 12.00 | 271 | 282 | 9.1 | 0 | 0 |

TABLE 2-continued

|  | Bi | Cu | Ge | Ag | Solidus | Liquidus | Elongation | Bridging | Heat Cycle |
|---|---|---|---|---|---|---|---|---|---|
| Example 22 | 98.63 | 0.33 | 0.29 | 0.75 | 282 | 287 | 1.2 | 0 | 0 |
| Example 23 | 93.61 | 0.21 | 0.18 | 6.00 | 279 | 286 | 5.2 | 0 | 0 |
| Example 24 | 87.87 | 0.07 | 0.06 | 12.00 | 275 | 312 | 9.0 | 0 | 0 |

TABLE 3

| | First Alloy Preparation | | | | Second Alloy Preparation | |
|---|---|---|---|---|---|---|
| | Material | Mixing Ratio (wt %) | Alloy Composition (wt %) Bi | Cu | Ge | Material | Mixing Ratio (wt %) |
| Example 25 | (a) 99.5Bi—0.5Cu | 30 | 99.2 | 0.15 | 0.7 | (c) First Alloy 99.15Bi—0.15Cu—0.7Ge | 95 |
| | (b) 99.0Bi—1.0Ge | 70 | | | | (d) 80.0Bi—20.0Ag | 5 |
| Example 26 | (a) 99.5Bi—0.5Cu | 30 | 99.2 | 0.15 | 0.7 | (c) First Alloy 99.15Bi—0.15Cu—0.7Ge | 60 |
| | (b) 99.0Bi—1.0Ge | 70 | | | | (d) 80.0Bi—20.0Ag | 40 |
| Example 27 | (a) 99.5Bi—0.5Cu | 30 | 99.2 | 0.15 | 0.7 | (c) First Alloy 99.15Bi—0.15Cu—0.7Ge | 20 |
| | (b) 99.0Bi—1.0Ge | 70 | | | | (d) 80.0Bi—20.0Ag | 80 |
| Example 28 | (a) 99.5Bi—0.5Cu | 70 | 99.4 | 0.35 | 0.3 | (c) First Alloy 99.35Bi—0.35Cu—0.3Ge | 95 |
| | (b) 99.0Bi—1.0Ge | 30 | | | | (d) 80.0Bi—20.0Ag | 5 |
| Example 29 | (a) 99.5Bi—0.5Cu | 70 | 99.4 | 0.35 | 0.3 | (c) First Alloy 99.35Bi—0.35Cu—0.3Ge | 60 |
| | (b) 99.0Bi—1.0Ge | 30 | | | | (d) 80.0Bi—20.0Ag | 40 |
| Example 30 | (a) 99.5Bi—0.5Cu | 70 | 99.4 | 0.35 | 0.3 | (c) First Alloy 99.35Bi—0.35Cu—0.3Ge | 20 |
| | (b) 99.0Bi—1.0Ge | 30 | | | | (d) 80.0Bi—20.0Ag | 80 |
| Comparative Example 1 | (a) 99.5Bi—0.5Cu | 30 | 99.2 | 0.15 | 0.7 | (c) First Alloy 99.15Bi—0.15Cu—0.7Ge | 95.1 |
| | (b) 99.0Bi—1.0Ge | 70 | | | | (d) 97.5Bi—2.5Ag | 4.9 |
| Comparative Example 2 | (a) 99.5Bi—0.5Cu | 70 | 99.4 | 0.35 | 0.3 | (c) First Alloy 99.35Bi—0.35Cu—0.3Ge | 95.1 |
| | (b) 99.0Bi—1.0Ge | 30 | | | | (d) 97.5Bi—2.5Ag | 4.9 |
| Comparative Example 3 | (a) 99.5Bi—0.5Cu | 30 | 99.2 | 0.15 | 0.7 | (c) First Alloy 99.15Bi—0.15Cu—0.7Ge | 19.9 |
| | (b) 99.0Bi—1.0Ge | 70 | | | | (d) 80.0Bi—20.0Ag | 80.1 |
| Comparative Example 4 | (a) 99.5Bi—0.5Cu | 70 | 99.4 | 0.35 | 0.3 | (c) First Alloy 99.35Bi—0.35Cu—0.3Ge | 19.9 |
| | (b) 99.0Bi—1.0Ge | 30 | | | | (d) 80.0Bi—20.0Ag | 80.1 |
| Comparative Example 5 | (a) 99.5Bi—0.5Cu | 30 | 99.2 | 0.15 | 0.7 | (c) First Alloy 99.15Bi—0.15Cu—0.7Ge | 95.1 |
| | (b) 99.0Bi—1.0Ge | 70 | | | | (d) 98.0Bi—2.0Ag | 4.9 |
| Comparative Example 6 | (a) 99.5Bi—0.5Cu | 30 | 99.2 | 0.15 | 0.7 | (c) First Alloy 99.15Bi—0.15Cu—0.7Ge | 19.9 |
| | (b) 99.0Bi—1.0Ge | 70 | | | | (d) 75Bi—25Ag | 80.1 |
| Comparative Example 7 | (a) 99.5Bi—0.5Cu | 30 | 99.2 | 0.15 | 0.7 | (c) First Alloy 99.15Bi—0.15Cu—0.7Ge | 95.1 |
| | (b) 99.0Bi—1.0Ge | 70 | | | | (d) 98.1Bi—1.9Ag | 4.9 |
| Comparative Example 8 | (a) 99.5Bi—0.5Cu | 30 | 99.2 | 0.15 | 0.7 | (c) First Alloy 99.15Bi—0.15Cu—0.7Ge | 95.1 |
| | (b) 99.0Bi—1.0Ge | 70 | | | | (d) 98.2Bi—1.8Ag | 4.9 |
| Comparative Example 9 | (a) 99.5Bi—0.5Cu | 30 | 99.2 | 0.15 | 0.7 | (c) First Alloy 99.15Bi—0.15Cu—0.7Ge | 19.9 |
| | (b) 99.0Bi—1.0Ge | 70 | | | | (d) 73.75Bi—26Ag | 80.1 |
| Comparative Example 10 | (a) 99.5Bi—0.5Cu | 30 | 99.2 | 0.15 | 0.7 | (c) First Alloy 99.15Bi—0.15Cu—0.7Ge | 19.9 |
| | (b) 99.0Bi—1.0Ge | 70 | | | | (d) 72.5Bi—27Ag | 80.1 |

| | Second Alloy Alloy Composition (wt %) | | | | Evaluation Melting Point | | | | |
|---|---|---|---|---|---|---|---|---|---|
| | Bi | Cu | Ge | Ag | Solidus Temp. (° C.) | Liquidus Temp. (° C.) | Elongation (%) | Bridging (%) | Heat Cycle (%) |
| Example 25 | 98.19 | 0.14 | 0.67 | 1.00 | 276 | 283 | 1.2 | 0 | 0 |
| Example 26 | 91.49 | 0.09 | 0.42 | 8.00 | 271 | 291 | 6.5 | 0 | 0 |
| Example 27 | 83.83 | 0.03 | 0.14 | 16.00 | 285 | 281 | 9.0 | 0 | 0 |
| Example 28 | 98.38 | 0.33 | 0.29 | 1.00 | 277 | 285 | 1.3 | 0 | 0 |
| Example 29 | 91.61 | 0.21 | 0.18 | 8.00 | 272 | 290 | 5.2 | 0 | 0 |
| Example 30 | 83.87 | 0.07 | 0.06 | 16.00 | 285 | 281 | 10.0 | 0 | 0 |
| Comparative Example 1 | 99.07 | 0.14 | 0.67 | 0.12 | 289 | 290 | 0.4 | 2 | 5 |
| Comparative Example 2 | 99.26 | 0.33 | 0.29 | 0.12 | 273 | 291 | 0.4 | 3 | 5 |
| Comparative Example 3 | 83.81 | 0.03 | 0.14 | 16.02 | 289 | 300 | 10.0 | 3 | 2 |
| Comparative Example 4 | 83.85 | 0.07 | 0.06 | 16.02 | 289 | 300 | 10.0 | 3 | 2 |
| Comparative Example 5 | 99.09 | 0.14 | 0.67 | 0.10 | 270 | 270 | 0.0 | 5 | 6 |
| Comparative Example 6 | 79.81 | 0.03 | 0.14 | 20.03 | 270 | 295 | 9.0 | 3 | 1 |
| Comparative Example 7 | 99.10 | 0.14 | 0.67 | 0.09 | 269 | 271 | 0.0 | 0 | 5 |

TABLE 3-continued

| | | | | | | | | | |
|---|---|---|---|---|---|---|---|---|---|
| Comparative Example 8 | 99.10 | 0.14 | 0.67 | 0.09 | 269 | 270 | 0.0 | 0 | 7 |
| Comparative Example 9 | 79.00 | 0.03 | 0.14 | 20.83 | 272 | 273 | 9.0 | 5 | 1 |
| Comparative Example 10 | 78.20 | 0.03 | 0.14 | 21.63 | 272 | 280 | 9.0 | 3 | 2 |

From the above results, it was confirmed for Examples 1 to 30 that solidus-line temperatures of 250 to 350° C., more specifically not less than 260° C., were obtained, a sufficient mechanical property of the elongation of 1 to 15% was presented, no bridging and no crack due to the heat cycles occurred, and excellent heat resistance reliability was presented. In contrast, for Comparative Examples 1, 2, 5, 7, and 8 each having the mixing rate of the Bi—Ag alloy set to be 4.9% by weight, it turned out that cracks due to the heat cycles were generated. For Comparative Examples 3, 4, 6, 9, and 10 each having the mixing rate of the Bi—Ag alloy set to be 80.1% by weight, the melting point was lowered and dripping of the solder alloy occurred during its melting to cause bridging.

Experimental Example 2

This experimental example relates to the second embodiment described with reference to FIG. 6.

As shown in Tables 4 and 5 below, in Examples 31 to 44 and Comparative Examples 11 to 16 relative to the solder alloy of Example 6, (g) the third alloy was prepared by using a Bi-007Cu-0.06Ge-2.0Ag alloy as (e) the second alloy, and (f) an additive metal element(s) of Ni and/or P at the mixing ratio shown in the tables. The alloy composition of the third alloy (solder alloy) thus prepared is also shown in the tables.

In the Comparative Examples, the mixing ratio of Ni and/or P (the total amount of these when both thereof are added) was set to be about 0.04% by weight and about 2.06% by weight that were very slightly shifted from the range of specified in the present invention.

Evaluation was conducted similarly to that of Experimental Example 1 for the solder material including the solder alloy of the above Examples and Comparative Examples. The results are also shown in Tables 4 and 5.

TABLE 4

| | | Third Alloy | | | | | |
|---|---|---|---|---|---|---|---|
| | | Preparation | | | Alloy Composition (wt %) | | |
| | | Material | Mixing Ratio (pbw) | Mixing Ratio (wt %) | Bi | Cu | Ge |
| Example 6 | (e) | Second Alloy 97.87Bi—0.07Cu—0.06Ge—2.0Ag | 100 | 100.00 | 97.87 | 0.07 | 0.06 |
| | (f) Ni | | 0 | 0.00 | | | |
| | P | | 0 | 0.00 | | | |
| Comparative Example 11 | (e) | Second Alloy 97.87Bi—0.07Cu—0.06Ge—2.0Ag | 100 | 99.96 | 97.83 | 0.07 | 0.06 |
| | (f) Ni | | 0.04 | 0.04 | | | |
| | P | | 0 | 0.00 | | | |
| Example 31 | (e) | Second Alloy 97.87Bi—0.07Cu—0.06Ge—2.0Ag | 100 | 99.95 | 97.82 | 0.07 | 0.06 |
| | (f) Ni | | 0.05 | 0.05 | | | |
| | P | | 0 | 0.00 | | | |
| Example 32 | (e) | Second Alloy 97.87Bi—0.07Cu—0.06Ge—2.0Ag | 100 | 99.90 | 97.77 | 0.07 | 0.06 |
| | (f) Ni | | 0.1 | 0.10 | | | |
| | P | | 0 | 0.00 | | | |
| Example 33 | (e) | Second Alloy 97.87Bi—0.07Cu—0.06Ge—2.0Ag | 100 | 99.50 | 97.38 | 0.07 | 0.06 |
| | (f) Ni | | 0.5 | 0.50 | | | |
| | P | | 0 | 0.00 | | | |
| Example 34 | (e) | Second Alloy 97.87Bi—0.07Cu—0.06Ge—2.0Ag | 100 | 99.01 | 96.90 | 0.07 | 0.06 |
| | (f) Ni | | 1.0 | 0.99 | | | |
| | P | | 0 | 0.00 | | | |
| Example 35 | (e) | Second Alloy 97.87Bi—0.07Cu—0.06Ge—2.0Ag | 100 | 98.52 | 96.42 | 0.07 | 0.06 |
| | (f) Ni | | 1.5 | 1.48 | | | |
| | P | | 0 | 0.00 | | | |
| Example 36 | (e) | Second Alloy 97.87Bi—0.07Cu—0.06Ge—2.0Ag | 100 | 98.04 | 95.95 | 0.07 | 0.06 |
| | (f) Ni | | 2.0 | 1.96 | | | |
| | P | | 0 | 0.00 | | | |
| Comparative Example 12 | (e) | Second Alloy 97.87Bi—0.07Cu—0.06Ge—2.0Ag | 100 | 97.94 | 95.86 | 0.07 | 0.06 |
| | (f) Ni | | 2.1 | 2.06 | | | |
| | P | | 0 | 0.00 | | | |

TABLE 4-continued

|  | | Third Alloy Alloy Composition (wt %) | | | Evaluation | | | | |
|---|---|---|---|---|---|---|---|---|---|
|  | | | | | Melting Point | | | | |
|  | | | | | Solidus Temp. | Liquidus Temp. | Elongation | Bridging | Heat Cycle |
|  | | Ag | Ni | P | (° C.) | (° C.) | (%) | (%) | (%) |
| Example 6 | | 2.00 | 0 | 0 | 272 | 290 | 2.2 | 0 | 0 |
| Comparative Example 11 | | 2.00 | 0.04 | 0 | 270 | 295 | 2.0 | 0 | 1 |
| Example 31 | | 2.00 | 0.05 | 0 | 271 | 283 | 2.2 | 0 | 0 |
| Example 32 | | 2.00 | 0.10 | 0 | 275 | 292 | 2.7 | 0 | 0 |
| Example 33 | | 1.99 | 0.50 | 0 | 272 | 296 | 3.2 | 0 | 0 |
| Example 34 | | 1.98 | 0.99 | 0 | 272 | 309 | 3.5 | 0 | 0 |
| Example 35 | | 1.97 | 1.48 | 0 | 273 | 285 | 3.7 | 0 | 0 |
| Example 36 | | 1.96 | 1.96 | 0 | 273 | 291 | 4.0 | 0 | 0 |
| Comparative Example 12 | | 1.96 | 2.06 | 0 | 273 | 305 | 3.9 | 0 | 3 |

TABLE 5

|  |  | Third Alloy | | | | | |
|---|---|---|---|---|---|---|---|
|  |  | Preparation | | | | | |
|  |  |  | Mixing Ratio | Mixing Ratio | Alloy Composition (wt %) | | |
|  | Material | | (pbw) | (wt %) | Bi | Cu | Ge |
| Comparative Example 13 | (e) Second Alloy 97.87Bi—0.07Cu—0.06Ge—2.0Ag<br>(f) Ni<br>P | | 100<br>0<br>0.04 | 99.96<br>0.00<br>0.04 | 97.83 | 0.07 | 0.06 |
| Example 37 | (e) Second Alloy 97.87Bi—0.07Cu—0.06Ge—2.0Ag<br>(f) Ni<br>P | | 100<br>0<br>0.05 | 99.95<br>0.00<br>0.05 | 97.82 | 0.07 | 0.06 |
| Example 38 | (e) Second Alloy 97.87Bi—0.07Cu—0.06Ge—2.0Ag<br>(f) Ni<br>P | | 100<br>0<br>0.1 | 99.90<br>0.00<br>0.10 | 97.77 | 0.07 | 0.06 |
| Example 39 | (e) Second Alloy 97.87Bi—0.07Cu—0.06Ge—2.0Ag<br>(f) Ni<br>P | | 100<br>0<br>0.5 | 99.50<br>0.00<br>0.50 | 97.38 | 0.07 | 0.06 |
| Example 40 | (e) Second Alloy 97.87Bi—0.07Cu—0.06Ge—2.0Ag<br>(f) Ni<br>P | | 100<br>0<br>1 | 99.01<br>0.00<br>0.99 | 96.90 | 0.07 | 0.06 |
| Example 41 | (e) Second Alloy 97.87Bi—0.07Cu—0.06Ge—2.0Ag<br>(f) Ni<br>P | | 100<br>0<br>1.5 | 98.52<br>0.00<br>1.48 | 96.42 | 0.07 | 0.06 |
| Example 42 | (e) Second Alloy 97.87Bi—0.07Cu—0.06Ge—2.0Ag<br>(f) Ni<br>P | | 100<br>0<br>2 | 98.04<br>0.00<br>1.96 | 95.95 | 0.07 | 0.06 |
| Comparative Example 14 | (e) Second Alloy 97.87Bi—0.07Cu—0.06Ge—2.0Ag<br>(f) Ni<br>P | | 100<br>0<br>2.1 | 97.94<br>0.00<br>2.06 | 95.86 | 0.07 | 0.06 |
| Comparative Example 15 | (e) Second Alloy 97.87Bi—0.07Cu—0.06Ge—2.0Ag<br>(f) Ni<br>P | | 100<br>0.03<br>0.01 | 99.96<br>0.03<br>0.01 | 97.83 | 0.07 | 0.06 |
| Example 43 | (e) Second Alloy 97.87Bi—0.07Cu—0.06Ge—2.0Ag<br>(f) Ni<br>P | | 100<br>0.03<br>0.02 | 99.95<br>0.03<br>0.02 | 97.82 | 0.07 | 0.06 |
| Example 44 | (e) Second Alloy 97.87Bi—0.07Cu—0.06Ge—2.0Ag<br>(f) Ni<br>P | | 100<br>0.6<br>1.3 | 98.14<br>0.59<br>1.28 | 96.05 | 0.07 | 0.06 |
| Comparative Example 16 | (e) Second Alloy 97.87Bi—0.07Cu—0.06Ge—2.0Ag<br>(f) Ni<br>P | | 100<br>0.3<br>1.8 | 97.94<br>0.29<br>1.76 | 95.86 | 0.07 | 0.06 |

TABLE 5-continued

|  | Third Alloy Alloy Composition (wt %) | | | Evaluation | | | | |
|---|---|---|---|---|---|---|---|---|
|  | | | | Melting Point | | | | |
|  | | | | Solidus Temp. | Liquidus Temp. | Elongation | Bridging | Heat Cycle |
|  | Ag | Ni | P | (° C.) | (° C.) | (%) | (%) | (%) |
| Comparative Example 13 | 2.00 | 0 | 0.04 | 270 | 295 | 1.8 | 0 | 1 |
| Example 37 | 2.00 | 0 | 0.05 | 271 | 281 | 2.5 | 0 | 0 |
| Example 38 | 2.00 | 0 | 0.10 | 274 | 291 | 2.7 | 0 | 0 |
| Example 39 | 1.99 | 0 | 0.50 | 273 | 297 | 3.2 | 0 | 0 |
| Example 40 | 1.98 | 0 | 0.99 | 271 | 312 | 3.5 | 0 | 0 |
| Example 41 | 1.97 | 0 | 1.48 | 274 | 291 | 3.7 | 0 | 0 |
| Example 42 | 1.96 | 0 | 1.96 | 273 | 297 | 4.0 | 0 | 0 |
| Comparative Example 14 | 1.96 | 0 | 2.06 | 271 | 312 | 3.9 | 1 | 5 |
| Comparative Example 15 | 2.00 | 0.03 | 0.01 | 271 | 295 | 3.9 | 2 | 3 |
| Example 43 | 2.00 | 0.03 | 0.02 | 273 | 382 | 4.3 | 0 | 0 |
| Example 44 | 1.96 | 0.59 | 1.28 | 271 | 292 | 2.5 | 0 | 0 |
| Comparative Example 16 | 1.96 | 0.29 | 1.76 | 274 | 295 | 2.3 | 2 | 5 |

From the above results, it was confirmed for Examples 31 to 44 that solidus-line temperatures of not less 270° C. were obtained, a sufficient mechanical property of the elongation of 1 to 15% was presented, no bridging and no crack due to the heat cycles occurred, and excellent heat resistance reliability was presented. In contrast, for Comparative Examples 11, 13, and 15 each having the mixing rate of Ni and/or P (the total amount of these when both thereof were added) set to be about 0.04% by weight, and Comparative Examples 12, 14, and 16 each having the mixing rate thereof set to be about 2.06% by weight, it turned out that cracks due to the heat cycles and bridging occurred. More specifically, the elongation was increased when the mixing ratio of Ni and/or P was set to be 0.05 to 2.0% by weight and, in contrast, the elongation was reduced when the mixing ratio thereof was set to be not more than 0.05% by weight, and the reliability was insufficient during the heat cycles with the mixing ratio thereof set to be not less than 2.0% by weight.

Experimental Example 3

This experimental example relates to the third embodiment described with reference to FIG. 7.

As shown in Table 6 below, in as Examples 45 to 54 relative to the solder alloy of Example 6, (i) the particle dispersed second alloy was prepared by using a Bi-007Cu-0.06Ge-2.0Ag alloy as (e) the second alloy, and (h) additive particles of Cu particles and/or Ni particles having the average particle diameter of 23 μm at the mixing ratio shown in the table. As to the prepared particle dispersed second alloy (solder alloy), the alloy composition of the second alloy constituting the matrix and the particle content in the solder alloy are also shown in the table.

Evaluation was conducted similarly to that of Experimental Example 1 for the solder material including the solder alloy of the above Examples. The results are together shown in Table 6.

TABLE 6

|  | Second Alloy Alloy Composition (wt %) | | | | Particle-Mixing Ratio (pbw)* | | Particle Content (wt %) | | Evaluation | | | | |
|---|---|---|---|---|---|---|---|---|---|---|---|---|---|
|  | | | | | | | | | Melting Point | | | | |
|  | | | | | | | | | Solidus Temp. | Liquidus Temp. | Elongation | Bridging | Heat Cycle |
|  | Bi | Cu | Ge | Ag | Cu Particles | Ni Particles | Cu Particles | Ni Particles | (° C.) | (° C.) | (%) | (%) | (%) |
| Example 6 | 97.87 | 0.07 | 0.06 | 2.00 | 0 | 0 | 0.00 | 0.00 | 272 | 290 | 2.2 | 0 | 0 |
| Example 45 | 97.87 | 0.07 | 0.06 | 2.00 | 1 | 0 | 0.99 | 0.00 | 273 | 274 | 2.3 | 0 | 0 |
| Example 46 | 97.87 | 0.07 | 0.06 | 2.00 | 5 | 0 | 4.76 | 0.00 | 279 | 285 | 2.5 | 0 | 0 |
| Example 47 | 97.87 | 0.07 | 0.06 | 2.00 | 10 | 0 | 9.09 | 0.00 | 280 | 281 | 3.2 | 0 | 0 |
| Example 48 | 97.87 | 0.07 | 0.06 | 2.00 | 15 | 0 | 13.04 | 0.00 | 293 | 295 | 2.8 | 0 | 0 |
| Example 49 | 97.87 | 0.07 | 0.06 | 2.00 | 20 | 0 | 16.67 | 0.00 | 300 | 301 | 2.0 | 0 | 0 |
| Example 50 | 97.87 | 0.07 | 0.06 | 2.00 | 0 | 1 | 0.00 | 0.99 | 274 | 275 | 3.5 | 0 | 0 |
| Example 51 | 97.87 | 0.07 | 0.06 | 2.00 | 0 | 5 | 0.00 | 4.76 | 281 | 285 | 3.7 | 0 | 0 |
| Example 52 | 97.87 | 0.07 | 0.06 | 2.00 | 0 | 10 | 0.00 | 9.09 | 282 | 283 | 4.3 | 0 | 0 |
| Example 53 | 97.87 | 0.07 | 0.06 | 2.00 | 0 | 15 | 0.00 | 13.04 | 294 | 297 | 1.8 | 0 | 0 |
| Example 54 | 97.87 | 0.07 | 0.06 | 2.00 | 0 | 20 | 0.00 | 16.67 | 302 | 305 | 2.3 | 0 | 0 |

*with respect to 100 pbw (parts by weigt) of Second Alloy

From the above results, it was confirmed for Examples 45 to 54 that solidus-line temperatures of not less than 270° C. were obtained, a sufficient mechanical property of the elongation of 1 to 15% was presented, no bridging and no crack due to the heat cycles occurred, and excellent heat resistance reliability was presented.

Experimental Example 4

This experimental example relates to the fourth embodiment described with reference to FIG. 8.

As shown in Tables 7 and 8 below, in Examples 55 to 70 relative to the solder alloy of Example 6, (g) the third alloy was prepared by using a Bi-007Cu-0.06Ge-2.0Ag alloy as (e) the second alloy, and (f) the additive metal element of Ni and/or P at the mixing ratio shown in Tables 7 and 8, and (j) the particle dispersed third alloy was further prepared by using (g) this third alloy and (h) additive particles of Cu particles and/or Ni particles having the average particle diameter of 26 μm at the mixing ratio shown in the tables. As to the prepared particle dispersed third alloy (solder alloy), the composition of the third alloy constituting the matrix and the particle content in the solder alloy are also shown in the tables.

Evaluation was conducted similarly to that of Experimental Example 1 for the solder material including the solder alloy of the above Examples. The results are together shown in Tables 7 and 8.

TABLE 7

| | | Third Alloy | | | | | | | |
|---|---|---|---|---|---|---|---|---|---|
| | Preparation | | | Alloy Composition (wt %) | | | | | |
| | Material | Mixing Ratio (pbw) | Mixing Ratio (wt %) | Bi | Cu | Ge | Ag | Ni | P |
| Example 6 | (e) Second Alloy 97.87Bi—0.07Cu—0.06Ge—2.0Ag | 100 | 100.00 | 97.87 | 0.07 | 0.06 | 2.00 | 0 | 0 |
| | (f) Ni | 0 | 0.00 | | | | | | |
| | P | 0 | 0.00 | | | | | | |
| Example 55 | (e) Second Alloy 97.87Bi—0.07Cu—0.06Ge—2.0Ag | 100 | 98.52 | 96.42 | 0.07 | 0.06 | 1.97 | 1.48 | 0 |
| | (f) Ni | 1.5 | 1.48 | | | | | | |
| | P | 0 | 0.00 | | | | | | |
| Example 56 | (e) Second Alloy 97.87Bi—0.07Cu—0.06Ge—2.0Ag | 100 | 98.52 | 96.42 | 0.07 | 0.06 | 1.97 | 1.38 | 0.10 |
| | (f) Ni | 1.4 | 1.38 | | | | | | |
| | P | 0.1 | 0.10 | | | | | | |
| Example 57 | (e) Second Alloy 97.87Bi—0.07Cu—0.06Ge—2.0Ag | 100 | 98.19 | 96.10 | 0.07 | 0.06 | 1.96 | 1.77 | 0.04 |
| | (f) Ni | 1.8 | 1.77 | | | | | | |
| | P | 0.04 | 0.04 | | | | | | |
| Example 58 | (e) Second Alloy 97.87Bi—0.07Cu—0.06Ge—2.0Ag | 100 | 99.76 | 97.64 | 0.07 | 0.06 | 2.00 | 0.20 | 0.04 |
| | (f) Ni | 0.2 | 0.20 | | | | | | |
| | P | 0.04 | 0.04 | | | | | | |
| Example 59 | (e) Second Alloy 97.87Bi—0.07Cu—0.06Ge—2.0Ag | 100 | 98.23 | 96.14 | 0.07 | 0.06 | 1.96 | 1.57 | 0.20 |
| | (f) Ni | 1.6 | 1.57 | | | | | | |
| | P | 0.2 | 0.20 | | | | | | |
| Example 60 | (e) Second Alloy 97.87Bi—0.07Cu—0.06Ge—2.0Ag | 100 | 99.40 | 97.29 | 0.07 | 0.06 | 1.99 | 0.50 | 0.10 |
| | (f) Ni | 0.5 | 0.50 | | | | | | |
| | P | 0.1 | 0.10 | | | | | | |
| Example 61 | (e) Second Alloy 97.87Bi—0.07Cu—0.06Ge—2.0Ag | 100 | 99.36 | 97.25 | 0.07 | 0.06 | 1.99 | 0.60 | 0.04 |
| | (f) Ni | 0.6 | 0.60 | | | | | | |
| | P | 0.04 | 0.04 | | | | | | |
| Example 62 | (e) Second Alloy 97.87Bi—0.07Cu—0.06Ge—2.0Ag | 100 | 99.17 | 97.05 | 0.07 | 0.06 | 1.98 | 0.79 | 0.04 |
| | (f) Ni | 0.8 | 0.79 | | | | | | |
| | P | 0.04 | 0.04 | | | | | | |

| | Evaluation | | | | | | | | |
|---|---|---|---|---|---|---|---|---|---|
| | Particle-Mixing Ratio (pbw)** | | Particle Content (wt %) | | Melting Point | | | | |
| | | | | | Solidus | Liquidus | | | |
| | Cu Particles | Ni Particles | Cu Particles | Ni Particles | Temp. (° C.) | Temp. (° C.) | Elongation (%) | Bridging (%) | Heat Cycle (%) |
| Example 6 | 0 | 0 | 0.00 | 0.00 | 272 | 290 | 2.2 | 0 | 0 |
| Example 55 | 2 | 0 | 1.96 | 0.00 | 281 | 294 | 3.9 | 0 | 0 |
| Example 56 | 3 | 0 | 2.91 | 0.00 | 283 | 288 | 4.3 | 0 | 0 |
| Example 57 | 5 | 0 | 4.76 | 0.00 | 285 | 295 | 1.8 | 0 | 0 |
| Example 58 | 7 | 0 | 6.54 | 0.00 | 289 | 300 | 2.3 | 0 | 0 |
| Example 59 | 10 | 0 | 9.09 | 0.00 | 280 | 295 | 3.9 | 0 | 0 |
| Example 60 | 15 | 0 | 13.04 | 0.00 | 290 | 300 | 4.3 | 0 | 0 |
| Example 61 | 17 | 0 | 14.53 | 0.00 | 295 | 305 | 1.8 | 0 | 0 |
| Example 62 | 20 | 0 | 16.67 | 0.00 | 300 | 310 | 2.3 | 0 | 0 |

TABLE 8

| | | Preparation | | Alloy Composition (wt %) | | | | | |
|---|---|---|---|---|---|---|---|---|---|
| | Material | Mixing Ratio (pbw) | Mixing Ratio (wt %) | Bi | Cu | Ge | Ag | Ni | P |
| Example 63 | (e) Second Alloy 97.87Bi—0.07Cu—0.06Ge—2.0Ag | 100 | 98.72 | 96.61 | 0.07 | 0.06 | 1.97 | 1.28 | 0 |
| | (f) Ni | 1.3 | 1.28 | | | | | | |
| | P | 0 | 0.00 | | | | | | |
| Example 64 | (e) Second Alloy 97.87Bi—0.07Cu—0.06Ge—2.0Ag | 100 | 98.43 | 96.33 | 0.07 | 0.06 | 1.97 | 1.48 | 0.10 |
| | (f) Ni | 1.5 | 1.48 | | | | | | |
| | P | 0.1 | 0.10 | | | | | | |
| Example 65 | (e) Second Alloy 97.87Bi—0.07Cu—0.06Ge—2.0Ag | 100 | 98.58 | 96.48 | 0.07 | 0.06 | 1.97 | 1.38 | 0.04 |
| | (f) Ni | 1.4 | 1.38 | | | | | | |
| | P | 0.04 | 0.04 | | | | | | |
| Example 66 | (e) Second Alloy 97.87Bi—0.07Cu—0.06Ge—2.0Ag | 100 | 98.10 | 96.01 | 0.07 | 0.06 | 1.96 | 1.86 | 0.04 |
| | (f) Ni | 1.9 | 1.86 | | | | | | |
| | P | 0.04 | 0.04 | | | | | | |
| Example 67 | (e) Second Alloy 97.87Bi—0.07Cu—0.06Ge—2.0Ag | 100 | 98.72 | 96.61 | 0.07 | 0.06 | 1.97 | 1.18 | 0.10 |
| | (f) Ni | 1.2 | 1.18 | | | | | | |
| | P | 0.1 | 0.10 | | | | | | |
| Example 68 | (e) Second Alloy 97.87Bi—0.07Cu—0.06Ge—2.0Ag | 100 | 98.33 | 96.23 | 0.07 | 0.06 | 1.97 | 1.57 | 0.10 |
| | (f) Ni | 1.6 | 1.57 | | | | | | |
| | P | 0.1 | 0.10 | | | | | | |
| Example 69 | (e) Second Alloy 97.87Bi—0.07Cu—0.06Ge—2.0Ag | 100 | 98.33 | 96.23 | 0.07 | 0.06 | 1.97 | 1.47 | 0.20 |
| | (f) Ni | 1.5 | 1.47 | | | | | | |
| | P | 0.2 | 0.20 | | | | | | |
| Example 70 | (e) Second Alloy 97.87Bi—0.07Cu—0.06Ge—2.0Ag | 100 | 98.23 | 96.14 | 0.07 | 0.06 | 1.96 | 1.67 | 0.10 |
| | (f) Ni | 1.7 | 1.67 | | | | | | |
| | P | 0.1 | 0.10 | | | | | | |

| | Particle-Mixing Ratio (pbw)** | | Particle Content (wt %) | | Melting Point | | Evaluation | | |
|---|---|---|---|---|---|---|---|---|---|
| | Cu Particles | Ni Particles | Cu Particles | Ni Particles | Solidus Temp. (° C.) | Liquidus Temp. (° C.) | Elongation (%) | Bridging (%) | Heat Cycle (%) |
| Example 63 | 0 | 2 | 0.00 | 1.96 | 281 | 295 | 3.9 | 0 | 0 |
| Example 64 | 0 | 3 | 0.00 | 2.91 | 283 | 290 | 4.3 | 0 | 0 |
| Example 65 | 0 | 5 | 0.00 | 4.76 | 285 | 296 | 1.8 | 0 | 0 |
| Example 66 | 0 | 7 | 0.00 | 6.54 | 289 | 303 | 2.3 | 0 | 0 |
| Example 67 | 0 | 10 | 0.00 | 9.09 | 280 | 298 | 3.9 | 0 | 0 |
| Example 68 | 0 | 15 | 0.00 | 13.04 | 290 | 309 | 4.3 | 0 | 0 |
| Example 69 | 0 | 17 | 0.00 | 14.53 | 295 | 308 | 1.8 | 0 | 0 |
| Example 70 | 0 | 20 | 0.00 | 16.67 | 300 | 315 | 2.3 | 0 | 0 |

**with respect to 100 pbw (parts by weigt) of Third Alloy (which is also applied to Table 7)

From the above results, it was confirmed for Examples 55 to 70 that solidus-line temperatures of not less than 270° C. were obtained, a sufficient mechanical property of the elongation of 1 to 15% was presented, no bridging and no crack due to the heat cycles occurred, and excellent heat resistance reliability was presented.

Experimental Example 5

In the above Application Example 3, the flat lead 15 of the electronic component shown in FIG. 14 applied with one of Bi plating, Ni plating, Au plating, and Ni-based and Au flash plating are connected with the Cu electrode land 20 of the mother substrate 19 by using the solder paste including the solder alloy of Example 6 (the same solder paste as that prepared for the evaluation as to the heat cycles in Experimental Example 1), and the defective mounting rate in the heat cycle test was evaluated for thus obtained electronic component mounting substrate similarly to that of the Experimental Example 1. The results are shown in Table 9.

TABLE 9

| | Evaluation | | |
|---|---|---|---|
| | Elongation (%) | Bridging (%) | Heat Cycle (%) |
| Bi Plating | 2.0 | 0 | 0 |
| Au Plating | 3.9 | 0 | 0 |
| Ni Plating | 4.3 | 0 | 0 |
| Ni-based and Au-flash plating | 1.8 | 0 | 0 |
| Sn Plating | 2.3 | 6 | 7 |

From the above results, most excellent heat resistance reliability was obtained in the case where the Bi plating was applied.

Experimental Example 6

According to Application Example 1 (see FIG. 11) of the connected structure, the module component 11 was fabricated by using the electronic component 7 of which the electrode 8 was plated by Ni-based and Au flash plating (whose Sn content ratio was less than 0.5% by weight except inevitable impurities) and by using the module substrate 9 of which electrode land 12 was a Cu electrode land (whose Sn content ratio was less than 0.5% by weight except inevitable impurities). A solder material including the solder alloy of Example 64 was used as the solder material. Thus obtained module component was subjected to a high temperature storage test at 150° C. and for 500 hours, and the measurement value of the connecting strength after the test was 84% of the connecting strength before the test (the initial value) and was higher than "80% or more" that was the reference value. It was confirmed from this result that Sn-58% Bi eutectic alloy (eutectic point of 138° C.), which is a low melting point alloy, was not generated or sufficiently suppressed from generating in the solder connecting portion, and the heat resistance reliability was able to be maintained.

For comparison, a module component was fabricated similarly to the above except that the Sn content ratio in the Ni-based and Au flash plating of the electrode 8 of the electronic component or the Sn content ratio of the Cu electrode land of the electrode 12 of the module substrate 9 was set to be 0.5% by weight and 1.0% by weight except inevitable impurities. Thus obtained module component was subjected to the same test, and the measurement values of the connecting strength after the test were 76% and 71% of the connecting strength before the test (the initial value) and were lower than 80% that was the reference value. It can be considered from this result that the heat resistance reliability of the module components was significantly influenced and the module components were therefore not suitable for the use as products.

Experimental Example 7

According to Application Example 3 (see FIG. 14) of the connected structure, the electronic component mounting substrate was fabricated by using the flat lead 15 that was applied with Ni-based and Au flash plating (whose Sn content ratio was less than 0.5% by weight except inevitable impurities) and by using the mother substrate 19 of which electrode land 20 was a Cu electrode land (whose Sn content ratio was less than 0.5% by weight except inevitable impurities). A solder material including the solder alloy of Example 68 was used as the solder material. Thus obtained electronic component mounting substrate was subjected to a high temperature storage test at 150° C. and for 500 hours, and the measurement value of the connecting strength after the test was 82% of the connecting strength before the test (the initial value) and was higher than "80% or more" that was the reference value. It was confirmed from this result that Sn-58% Bi eutectic alloy (eutectic point of 138° C.), which is a low melting point alloy, was not generated or sufficiently suppressed from generating in the solder connecting portion, and the heat resistance reliability was able to be maintained.

INDUSTRIAL APPLICABILITY

The solder material of the present invention can widely be used as a lead-free solder material and can advantageously be used for, for example, an on-vehicle electronic apparatus and a power device while it is not limited to these applications. The solder material of the present invention is usable as a lead-free solder material directed to use at a high temperature that would be difficult to be practically used before the present invention, and elimination of lead can be realized not only on the traditional mother substrate but also in a module component and further in an electronic component, which contributes to complete "elimination of lead" of solder materials. Electric and/or electronic apparatuses each imposing a small load on the global environment can be produced without being subject to the restrictions of any globally prevailing legal regulations for lead.

This application claims priority to and the benefit of Japanese Patent Application No. 2013-250521, filed Dec. 3, 2013, the entire contents of which is incorporated herein by reference.

REFERENCE SIGNS LIST

1 solder connecting portion (solder material)
2 lead frame
3 semiconductor element
4 bonding wire
5 sealing resin
6 mother substrate
7 electronic component
8 electrode
9 module substrate
10 solder connecting portion (solder material)
11 module component
12 electrode land
14 Cu particles and/or Ni particles
15 flat lead
16 solder connecting portion (solder material)
17 metal foil
18 power transistor
19 mother substrate
20 electrode land
21 solder connecting portion (solder material)
31 solder particle
33 high melting point film (high melting point material)
30 coated particle

The invention claimed is:

1. A solder material comprising, as a solder alloy, a second alloy obtainable by using a first alloy and a Bi—Ag alloy at a ratio of 5 to 80% by weight for the Bi—Ag alloy relative to a total amount of the first alloy and the Bi—Ag alloy, the first alloy being obtainable by using a Bi—Cu alloy and a Bi—Ge alloy at a ratio of 30 to 70% by weight for the Bi—Cu alloy relative to a total amount of the Bi—Cu alloy and the Bi—Ge alloy, wherein
  the Bi—Cu alloy consists of 0.2 to 0.8% by weight of Cu and a balance of Bi,
  the Bi—Ge alloy consists of 0.7 to 1.3% by weight of Ge and a balance of Bi,
  the Bi—Ag alloy consists of 2.2 to 20.3% by weight of Ag and a balance of Bi, and
  the second alloy comprises 0.06% by weight or more of Ge.

2. The solder material according to claim 1, wherein
  the Bi—Cu alloy is a Bi—Cu eutectic alloy,
  the Bi—Ge alloy is a Bi—Ge eutectic alloy, and
  the Bi—Ag alloy consists of 2.5 to 20% by weight of Ag and a balance of Bi.

3. The solder material according to claim 2, comprising, as the solder alloy, instead of the second alloy, a third alloy obtainable by using the second alloy and at least one of Ni and P at a ratio of 0.05 to 2.0% by weight for the at least one of Ni and P relative to a total amount of the second alloy and the at least one of Ni and P.

4. The solder material according to claim 2, further comprising, in the solder alloy, at least one of Cu particles and Ni particles having an average particle diameter of 1 to 40 µm at 1 to 20% by weight relative to a total amount of the solder alloy and the at least one of the Cu particles and the Ni particles.

5. The solder material according to claim 2, wherein the solder alloy has a solidus-line temperature of 250 to 350° C.

6. The solder material according to claim 2, wherein the solder alloy is in a form of particles, and a surface of the particles is coated with a material that has a melting point higher than the solidus-line temperature of the solder alloy.

7. The solder material according to claim 1, comprising, as the solder alloy, instead of the second alloy, a third alloy obtainable by using the second alloy and at least one of Ni and P at a ratio of 0.05 to 2.0% by weight for the at least one of Ni and P relative to a total amount of the second alloy and the at least one of Ni and P.

8. The solder material according to claim 7, further comprising, in the solder alloy, at least one of Cu particles and Ni particles having an average particle diameter of 1 to 40 µm at 1 to 20% by weight relative to a total amount of the solder alloy and the at least one of the Cu particles and the Ni particles.

9. The solder material according to claim 7, wherein the solder alloy has a solidus-line temperature of 250 to 350° C.

10. The solder material according to claim 7, wherein the solder alloy is in a form of particles, and a surface of the particles is coated with a material that has a melting point higher than the solidus-line temperature of the solder alloy.

11. The solder material according to claim 1, further comprising, in the solder alloy, at least one of Cu particles and Ni particles having an average particle diameter of 1 to 40 µm at 1 to 20% by weight relative to a total amount of the solder alloy and the at least one of the Cu particles and the Ni particles.

12. The solder material according to claim 11, wherein the solder alloy has a solidus-line temperature of 250 to 350° C.

13. The solder material according to claim 11, wherein the solder alloy is in a form of particles, and a surface of the particles is coated with a material that has a melting point higher than the solidus-line temperature of the solder alloy.

14. The solder material according to claim 1, wherein the solder alloy has a solidus-line temperature of 250 to 350° C.

15. The solder material according to claim 14, wherein the solder alloy is in a form of particles, and a surface of the particles is coated with a material that has a melting point higher than the solidus-line temperature of the solder alloy.

16. The solder material according to claim 1, wherein the solder alloy is in a form of particles, and a surface of the particles is coated with a material that has a melting point higher than the solidus-line temperature of the solder alloy.

17. A connected structure formed by connecting two members with each other between parts for connection of the respective two members by the solder material of claim 1.

18. The connected structure according to claim 17, wherein the parts for connection of the respective two members have an Sn content of less than 0.5% by weight in a material constituting at least a surface part of the parts for connection.

19. The connected structure according to claim 17, wherein the part for connection of at least one of the two members is plated with any one selected from a group consisting of Bi plating, Ni plating, Au plating, and Ni-based and Au-flash plating.

* * * * *